United States Patent
Iriguchi

(10) Patent No.: US 7,049,617 B2
(45) Date of Patent: May 23, 2006

(54) THICKNESS MEASUREMENT IN AN EXPOSURE DEVICE FOR EXPOSURE OF A FILM WITH A HOLOGRAM MASK, EXPOSURE METHOD AND SEMICONDUCTOR DEVICE MANUFACTURING METHOD

(75) Inventor: Chiharu Iriguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 411 days.

(21) Appl. No.: 10/201,153

(22) Filed: Jul. 24, 2002

(65) Prior Publication Data

US 2003/0039896 A1  Feb. 27, 2003

(30) Foreign Application Priority Data

Jul. 26, 2001 (JP) ............................. 2001-226714
Jul. 26, 2001 (JP) ............................. 2001-226717

(51) Int. Cl.
*G01N 21/86* (2006.01)

(52) U.S. Cl. ..................................... 250/548; 355/53
(58) Field of Classification Search ................ 250/548, 250/205, 559.27; 355/53
See application file for complete search history.

(56) References Cited

U.S. PATENT DOCUMENTS

| | | | |
|---|---|---|---|
| 4,966,428 A | 10/1990 | Phillips | 359/9 |
| 5,504,596 A | 4/1996 | Goto et al. | 359/24 |
| 5,695,894 A | 12/1997 | Clube | 430/1 |
| 5,877,845 A * | 3/1999 | Makinouchi | 355/53 |
| 5,994,006 A * | 11/1999 | Nishi | 430/22 |

FOREIGN PATENT DOCUMENTS

| | | |
|---|---|---|
| EP | 0 811 881 A2 | 12/1997 |
| JP | 62-141559 A * | 6/1987 |
| JP | 6-20913 | 1/1994 |
| JP | 6-260393 | 9/1994 |

\* cited by examiner

Primary Examiner—Thanh X. Luu
(74) Attorney, Agent, or Firm—Oliff & Berridge, PLC

(57) ABSTRACT

In an exposure device 100 having a vertically movable stage device 120, and which performs exposure by projecting a pattern recorded on a hologram mask 130 onto a substrate to be exposed 110 on which is formed a photosensitive material film 112 and which is placed on the above stage device, a film thickness measurement mechanism 160, 162 measures the thickness of the photosensitive material film 112, and based on the measured film thickness a light amount control mechanism 162 controls the amount of exposure light from the exposure light source 140. An appopriate amount of light is set according to the film thickness, so that an accurate pattern can be formed in a single exposure pass.

18 Claims, 17 Drawing Sheets

DRIVING SIGNAL

AREA A  AREA B

AREA A  AREA B

CONVENTIONAL METHOD

ST20

ST21

ST22

ST23

ST24

ST25

ST26

THICKNESS MEASUREMENT IN AN EXPOSURE DEVICE FOR EXPOSURE OF A FILM WITH A HOLOGRAM MASK, EXPOSURE METHOD AND SEMICONDUCTOR DEVICE MANUFACTURING METHOD

BACKGROUND OF THE INVENTION

1. Field of the Invention

This invention relates to an exposure device and exposure method, and in particular to an exposure device and exposure method which are suitable for use in holographic exposure technology. It also relates to a method of manufacture of semiconductor devices, of which transistors and integrated circuits are representative. It also relates to electro-optical devices and electronic appliance which uses active elements to drive an electro-optical layer such as liquid crystals, electroluminescence devices, or a disperse medium in which are dispersed electrophoretic particles.

2. Description of the Related Art

A fine pattern exposure technique utilizing so-called hologram exposure devices is attracting attention for use in semiconductor device patterning processes. In this exposure technique, first a pattern drawn on a photomask (original reticle) is caused to be recorded at the same size on the hologram recording face of an exposure plate, to create a hologram mask; then, by irradiating this hologram mask with reproduction light, the pattern information recorded on the hologram mask is reproduced on a film of resist or other photosensitive material, followed by exposure of a fine processing pattern.

A holographic exposure method employing this exposure principle in principle involves no aberrations due to lenses, since optical lenses are not required for radiation of exposure light; hence higher resolutions are obtained than in lithographic exposure methods. Further, there is compatibility with i-line processes which target high-resolution exposure. Also, there is the advantage that the equipment construction is relatively simple, and as a result the cost of equipment construction can be kept low.

In the holographic exposure method of the prior art, the exposure dose and focus are adjusted at the beginning of exposure, and the pattern exposure is repeated for these exposure conditions, to perform exposure of the entire substrate surface.

However, the holographic exposure method of the prior art has a number of problems.

First, while the resolution of the holographic exposure technique is high compared with that of ordinary mask exposure methods, in principle the focal depth is shallow. Hence the range in the depth direction of the photosensitive material film over which patterning is possible in a single exposure is narrow compared with ordinary mask exposure; for example, in a case in which exposure is to be performed so as to obtain a desired exposure pattern in a photosensitive material film formed on a substrate which has already been patterned, and the surface of which has depressions and protrusions, often it is necessary to perform so-called multiple exposure, in which the exposure is performed in several passes.

When the substrate for exposure is made larger in area, as for example when exposure a wafer 6 to 7 inches in diameter, the substrate itself may have warping or undulations. Even if a photosensitive material is formed to a uniform film thickness on a substrate with such poor flatness, because the flatness may be as large as 10 μm or more for every 10 cm, if exposure is performed using a holographic exposure device having a shallow focal depth in principle, the patterning dimensions after exposure will deviate greatly from the design values. In particular, when photosensitive material is applied to a substrate the surface of which has poor flatness, such as a glass substrate, the error in the patterning dimensions may be even greater.

SUMMARY OF THE INVENTION

In light of the above problems, an object of this invention is to provide an exposure device which can perform accurate single-pass exposure even of a photosensitive material film formed on a substrate the surface of which has depressions and protrusions.

An exposure device of this invention for exposure of a film for exposure comprises a light source, which irradiates the film for exposure with exposure light; a film thickness measurement mechanism, which measures the film thickness of the film for exposure; and a light amount control mechanism, which controls the amount of exposure light based on the measured film thickness.

According to this invention, the thickness of the film to be exposed is measured by the film thickness measurement mechanism, the amount of exposure light is controlled by the light amount control mechanism based on this [thickness], that is, the light amount is increased or decreased; hence even when the thickness of the film to be exposed is comparatively great, or the depth of field of the exposure light is comparatively shallow, the amount of exposure light is set according to the thickness of the film to be exposed. Consequently exposure of the film to be exposed can be completed in a single exposure pass, without the need to perform multiple exposure involving numerous passes. For example, in holographic exposure methods the depth of field is comparatively shallow, but by applying this invention, accurate patterning can be performed in a single exposure pass.

Here, "film to be exposed" refers to film of a photosensitive material commonly called resist, but may also be an object not in a film shape.

"Exposure light" refers to light used for exposure of the film to be exposed; the type of light is determined according to the application. For example, various types of laser light would be examples of exposure light.

"Light source" is configured to enable emission of exposure light, and includes laser devices and other light sources conventionally used for exposure.

"Film thickness measurement mechanism" has no particular constraints imposed on configuration, but may be a device which utilizes exposure light from the above light source to perform measurements, or may be a [device] which uses measurement light different from the light for measurement.

An exposure device of this invention further comprises a positioning mechanism, which positions the exposure master plate in the optical path of the exposure light, and a driving mechanism, which controls the distance between the exposure master plate and the film to be exposed. The exposure master plate is in the optical path, and the driving mechanism controls the distance between this master plate and the film to be exposed, so that even if depressions and protrusions occur in the exposure master plate, the driving mechanism controls the distance between the film to be exposed and the film to be exposed according to these depressions and protrusions; hence continued accurate exposure is possible.

Here "exposure master plate" refers to a plate on which is recorded pattern information which is to be recorded in the film to be exposed; when applied to holographic exposure techniques, this corresponds to what may be called a hologram mask on which is recorded the interference pattern of the original reticle.

In an exposure device of this invention, the driving mechanism comprises a first distance adjustment mechanism, and a second distance adjustment mechanism capable of finer adjustment than the first distance adjustment mechanism. After coarse distance control is performed by the first distance adjustment mechanism, fine adjustment is performed by the second distance adjustment mechanism, so that even if there are pronounced depressions and protrusions in the film to be exposed, fluctuations in the distance between the exposure master plate and the film to be exposed can be compensated in a comparatively short amount of time.

An exposure device of this invention further comprises a scanning mechanism which changes the relative positions of the film to be exposed and the exposure light. The scanning mechanism is configured to enable modification of the relative positional relation of the exposure light on the film to be exposed, so that a broad film to be exposed can be exposed uniformly.

In an exposure device of this invention, the film thickness measurement mechanism comprises an optical irradiation mechanism, which irradiates the film to be exposed with measurement light, and a reflectivity analysis mechanism, which analyzes the reflectivity of measurement light reflected by the film to be exposed. When measurement light emitted by the optical irradiation mechanism is reflected by the film to be exposed, the reflectivity changes according to the thickness of the film to be exposed. Hence by analyzing this reflectivity, the thickness of the film to be exposed can be obtained.

Here "reflectivity" does not necessary refer to reflectivity as commonly used, but may be understood to indicate the relative intensities of light before and after reflection.

An exposure device of this invention for performing exposure of film to be exposed comprises a light source, which emits exposure light toward the film to be exposed; a positioning mechanism, which positions the exposure master plate in the optical path of the exposure light; a driving mechanism, which controls the distance between the exposure master plate and the film to be exposed; and, a scanning mechanism, which changes the relative positions of the film to be exposed and the exposure light.

In this invention, when the film to be exposed is exposed according to pattern information recorded in the exposure master plate by means of transmission of exposure light through the exposure master plate, the driving mechanism controls the distance between this exposure master plate and the film to be exposed, so that even when there are depressions and protrusions in the film to be exposed, the driving mechanism maintains the appropriate distance between the film to be exposed and the exposure master plate corresponding to the depressions and protrusions, and continued accurate exposure is possible. In this state, the scanning mechanism causes the position of the exposure light relative to the film to be exposed to change, so that a broad film to be exposed can be exposed uniformly.

In an exposure device of this invention, the driving mechanism comprises a first distance adjustment mechanism, and a second distance adjustment mechanism capable of finer adjustment than the first distance adjustment mechanism. After coarse distance control is performed by the first distance adjustment mechanism, fine adjustment is performed by the second distance adjustment mechanism, so that even if there are pronounced depressions and protrusions in the film to be exposed, fluctuations in the distance between the exposure master plate and the film to be exposed can be compensated in a comparatively short amount of time.

An exposure device of this invention comprises a film thickness measurement mechanism, which measures the thickness of the film to be exposed, and a light amount control mechanism, which controls the amount of exposure light based on the measured film thickness. The film thickness measurement mechanism measures the thickness of the film to be exposed, and based on this the light amount control mechanism controls the amount of exposure light, that is, increases and decreases the amount of light, so that even when the thickness of the film to be exposed is comparatively great of the depth of field of the exposure light is comparatively shallow, the amount of exposure light can be set according to the thickness of the film to be exposed. Consequently exposure of the film to be exposed can be completed in a single exposure pass, without the need to perform multiple exposure involving numerous passes.

In an exposure device of this invention, the film thickness measurement mechanism comprises an optical irradiation mechanism, which irradiates the film to be exposed with measurement light, and a reflectivity analysis mechanism, which analyzes the reflectivity of measurement light reflected by the film to be exposed. When measurement light emitted by the optical irradiation mechanism is reflected by the film to be exposed, the reflectivity changes according to the thickness of the film to be exposed. Hence by analyzing this reflectivity, the thickness of the film to be exposed can be obtained.

Further, an exposure method of this invention for exposure of a film to be exposed comprises a process to measure the thickness of the film to be exposed; a process to determine the amount of exposure light for the film to be exposed, based on the measured film thickness; and a process to irradiate the film to be exposed with the determined amount of exposure light.

According to this invention, the thickness of the film to be exposed is measured, and based on this the amount of exposure light is controlled (that is, the amount of light is increased or decreased), so that even in cases where the thickness of the film to be exposed is comparatively large, or the depth of field of the exposure light is comparatively shallow, the amount of exposure light is set according to the thickness of the film to be exposed. Consequently exposure of the film to be exposed can be completed in a single exposure pass, without the need to perform multiple exposure involving numerous passes. For example, in holographic exposure methods the depth of field is comparatively shallow, but by applying this invention, accurate patterning can be performed in a single exposure pass.

An exposure method of this invention further comprises a process in which the exposure master plate is positioned in the optical path of the exposure light, and the distance between the exposure master plate and the film to be exposed is adjusted. Because the exposure master plate is in the optical path, and the distance between this master plate and the film to be exposed is controlled, continued accurate exposure is possible even if there are depressions and protrusions in the exposure master plate.

An exposure method of this invention further comprises a process in which the relative position of the film to be exposed and exposure light is changed. The positional relation of the exposure light relative to the film to be exposed changes, so that a broad film to be exposed can be exposed uniformly.

Also, an exposure method of this invention for exposure of a film to be exposed comprises a process in which the film to be exposed is irradiated with exposure light via an exposure master plate; a process in which the relative position of the film to be exposed and exposure light is changed; and a process in which the distance between the exposure master plate and the film to be exposed is controlled.

According to this invention, when the film to be exposed is exposed according to pattern information recorded on the exposure master plate by exposure light transmitted through the exposure master plate, the distance between the exposure master plate and the film to be exposed is controlled, so that even if there are depressions and protrusions in the exposure master plate, an appropriate distance between the film to be exposed and the film to be exposed is maintained, corresponding to the depressions and protrusions, and continued accurate exposure is possible. In this state, the scanning mechanism changes the position of the exposure light relative to the film to be exposed, so that a broad film to be exposed can be exposed uniformly.

An exposure method of this invention comprises a process to measure the thickness of the film to be exposed, and a process to control the amount of exposure light based on the measured film thickness. The thickness of the film to be exposed is measured, and the amount of exposure light is controlled (that is, the amount of light is increased or decreased) based on this thickness, so that even in cases where the thickness of the film to be exposed is comparatively large, or the depth of field of the exposure light is comparatively shallow, the amount of exposure light is set according to the thickness of the film to be exposed. Consequently exposure of the film to be exposed can be completed in a single exposure pass, without the need to perform multiple exposure involving numerous passes.

This invention also relates to a method for the manufacture of semiconductor devices, in which semiconductor devices are formed on a substrate, comprising each of the processes of the exposure methods of this invention. An accurate pattern is formed in the semiconductor device by means of an exposure method of this invention, so that a semiconductor device with the satisfactory performance of the device design can be provided.

Here "semiconductor device" refers to a device fabricated from films for exposure, and includes individual elements, such as transistors, diodes, resistors, inductors, capacitors, and other active or passive devices; integrated circuits and other circuits (chips) in which elements are wired so as to provide fixed functions; and, all or part of a device configured to provide fixed functions by combining a circuit in which are combined a plurality of elements, and one or more integrated circuits or other circuits.

An electro-optical device of this invention comprises a plurality of pixel areas; semiconductor devices provided for each pixel area; and electro-optical elements controlled by the semiconductor devices. The semiconductor devices are fabricated by a semiconductor device manufacturing method of this invention.

Here "electro-optical device" refers to general devices comprising a semiconductor device of this invention, and comprising electro-optical elements which either emit light through an electrical action or change the state of light emitted from outside; such electro-optical devices include both device which themselves emit light, and devices which control the transmission of light from outside. Electro-optical devices include, for example, active-matrix type display devices comprising, as electro-optical elements, liquid crystals, electrophoretic elements having a disperse medium in which are dispersed electrophoretic particles, EL (electroluminescence) particles, and electron emission elements which, under application of an electric field, emit electrons to stripe a luminescent plate.

This invention also relates to electronic appliance comprising a semiconductor device manufactured by a semiconductor device manufacturing method of this invention.

Here "electronic appliance" refers to general equipment comprising a semiconductor device of this invention and having fixed functions, and is configured comprising, for example, an electro-optical device and memory. There are no constraints in particular on the configuration, but such electronic appliance includes, for example, IC cards, portable telephones, video cameras, personal computers, head-mounted displays, rear-type or front-type projectors, fax machines with display functions, the viewfinders of digital cameras, portable televisions sets, DSP devices, PDAs, electronic organizers, electro-optical bulletin boards, and advertising displays.

BRIEF DESCRIPTION OF THE DRAWINGS

FIG. 9A through FIG. 9F explain an exposure method of this invention, and are manufacturing process cross-sectional diagrams which explain processes for performing one pattern exposure pass using an exposure method of this invention on a substrate the surface of which has depressions and protrusions;

DESCRIPTION OF THE PREFERRED EMBODIMENTS

Figure 1:
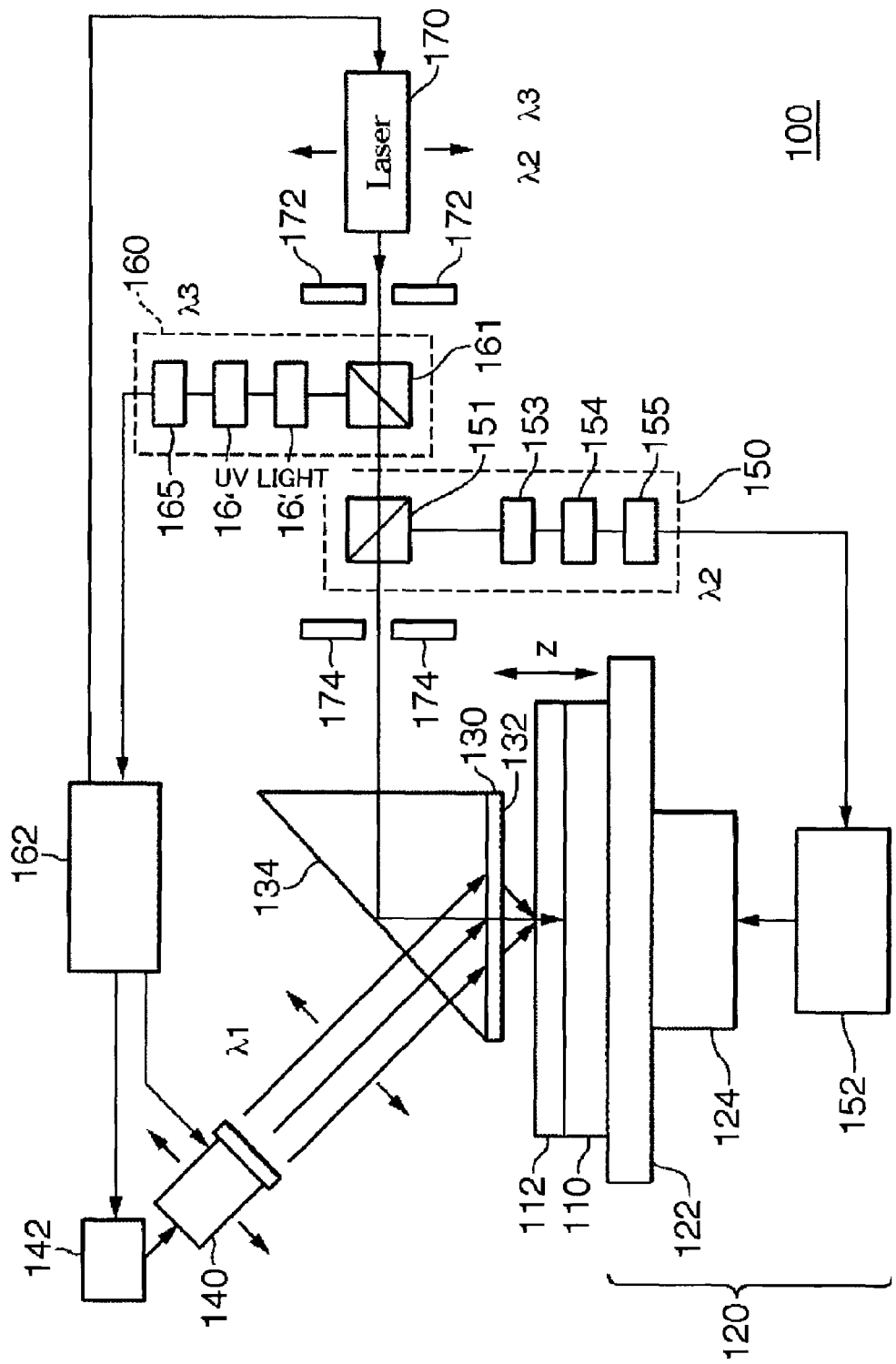
FIG. 1 explains in summary the entirety of a holographic exposure device of a first embodiment.

Below, aspects of the invention are explained, referring to the drawings.

First Embodiment

In a first embodiment, an exposure device and exposure method of this invention are applied to a reflection-type holographic exposure device employing total internal reflection holography.

FIG. 1 shows the entirety of a holographic exposure device of the first embodiment. As shown in FIG. 1, the exposure device 100 comprises a stage device 120; prism 134; exposure light source 140; exposure light source scanning device 142; distance measurement device 150; first information processing device (PC) 152; film thickness measurement device 160; second information processing device (PC) 162; and measurement light source 170.

A hologram mask 130, comprising a hologram recording surface 132 on which pattern information is recorded in advance by hologram exposure, is mounted onto the prism 134 using matching liquid or some other optical bonding means. The hologram mask 130 is positioned such that the hologram recording surface 132 and the plane of the substrate for exposure 110 are mutually parallel at a distance of, for example, approximately 100 μm. This hologram mask 130 corresponds to the exposure master plate of this invention. The prism 132 and a mechanism, not shown, which positions the prism in the optical path of the exposure light, correspond to the positioning mechanism of this invention. In this aspect, the hologram recording surface 132 of the hologram mask 130 has approximately the same area as the exposed area on the substrate for exposure 110.

The exposure light source 140 corresponds to the light source in this invention, and emits a light beam for exposure as the exposure light. The amount of exposure light emitted from the exposure light source is selected such that the pattern width after exposure or the film thickness is uniform throughout the entire extent of the exposure area. However, in accordance with the light amount control of this invention, fine adjustment of the light amount is possible by means of a light amount control signal from the PC 162. The exposure light source scanning device 142 corresponds to the scanning mechanism in this invention, and is configured to enable scanning and exposure of a desired exposure area of the substrate for exposure 110 by moving the exposure light source 140, based on a scanning signal output from the PC 162.

The driving mechanism of this invention comprises the stage device 120, together with a stage 122, stage driving device 124, and PC 152. The stage 122 is designed to hold the substrate for exposure 110 on which is formed a photosensitive material film 112, and which is a substrate for use in exposure. The photosensitive material film 112 comprises a resist, self-organizing film, or other photosensitive material which, after exposure by the exposure device, is developed; this film is applied to the substrate for exposure 110 by spin-coating or other coating means. This photosensitive material film 112 corresponds to the film to be exposed of this invention. The substrate for exposure 110 comprises a semiconductor wafer, glass plate or similar; after exposure and development of the photosensitive material film 112, etching or similar is performed to form the pattern. The substrate for exposure 110 is temporarily fixed to the stage 122 by, for example, a vacuum chuck method.

The stage driving device 124 is capable of driving the stage 122, under control of the PC 152, in at least the direction of the exposure light optical axis (the Z direction in the drawing). The PC 152 is configured so as to output a driving signal to drive the stage driving device 124, based on a signal from the distance measurement device 150. The above stage 122 can be adjusted by the PC 152 to a height such that exposure conditions are suitable when irradiating the photosensitive material film 112 with the exposure light beam. If necessary, the stage device 122 may also be moveable within the horizontal plane (XY plane) parallel to the plane of the stage 122, and may also be made rotatable within the above XY plane.

The distance measurement device 150, together with the PC 152, corresponds to the distance measurement mechanism of this invention, comprising a beam splitter 151, cylindrical lens 153, optical sensor 154, and error signal detector 155, and can output an error signal to the PC 152.

As explained above, the PC 152 can output a driving signal to control the stage driving device 124 based on the error signal from the distance measurement device 150.

More specifically, the distance measurement device 150 outputs an error signal for focus adjustment according to the distance between the hologram recording surface 132 and the surface of the photosensitive material film 112 applied onto the substrate for exposure 110. The PC 152 can output to the stage driving device 124 a driving signal so as to move the substrate for exposure 110 to an appropriate distance from the hologram mask 130, according to the error signal. The stage driving device 124 moves the stage 122 in the Z direction according to this driving signal, and as a result the position of the substrate for exposure 110 relative to the hologram mask 130 changes, so that appropriate focusing servo operation can be performed.

The film thickness measurement device 160, together with the PC 162, corresponds to the film thickness measurement mechanism of this invention, comprising a beam splitter 161, photodetector 163, amplifier 164, and A/D converter 165; the film top surface and bottom surface measurement device 160 detects a measurement light beam reflected from the thickness of the photosensitive material film 112 formed on the substrate for exposure 110, performs conversion to an electrical signal, and outputs a light detection signal.

The PC 162 corresponds to one portion of the film thickness measurement mechanism and scanning mechanism of this invention, and in addition to controlling the amount of light of the measurement light source 170, can control the amount of exposure light output by the exposure light source 140. The PC 162 can output a scanning signal to the exposure light source scanning device 142 so that the exposure light scans the exposure area of the photosensitive material film 112.

The measurement light source 170 emits a measurement beam under control of the PC 162. The measurement beam emitted from this measurement light source 170 can move in synchronization with the movement of the exposure light source 140 by means of a measurement control signal from the PC 162, in order to irradiate the exposure area of the surface of the substrate for exposure scanned by the exposure beam emitted by the above exposure light source 140.

More specifically, the measurement beam emitted from the measurement light source 170 according to a measurement control signal output from the PC 162 undergoes interference according to the thickness of the photosensitive material being irradiated, and the interference information is input to the PC 162 as a light detection signal and converted into film thickness information. Based on this interference information, the PC 162 calculates the amount of exposure light enabling exposure at the desired depth, and converts information relating the calculated amount of exposure light into a light amount control signal for control of the light amount of the exposure light source 140, enabling adjustment of the amount of exposure light of the exposure light source 140.

The apertures 172 and 174 are provided in order to regulate the outer peripheral shape of the unwanted diffuse light of the measurement beam, which is diffuse light.

In this aspect, as the exposure light emitted from the exposure light source 140, that is, as the reproduction light for reproducing the hologram pattern recorded on the hologram mask recording surface 132 onto the photosensitive material film 112, an exposure light beam of wavelength $\lambda_1$ is emitted. The diameter and shape of this exposure light beam can be freely selected according to the design of the pattern for microfabrication, but in this aspect, an exposure light beam of spot shape having a diameter of approximately 1 cm is assumed.

Further, in the holographic exposure device in this aspect, the measurement beam emitted from the measurement light source 170 is set to a wavelength different from that of the exposure light beam from the exposure light source 140, in order to enable measurement of the thickness of the photosensitive material film and measurement of the distance between the photosensitive material surface and the hologram mask recording surface. Here, as the measurement light source 170, it is assumed that a multi-wavelength laser capable of emitting light at different wavelengths $\lambda_2$ and $\lambda_3$ is used. However, a laser light source emitting light at the wavelengths $\lambda_2$ and $\lambda_3$ may be provided separately. The wavelengths $\lambda_2$ and $\lambda_3$ are selected such that there is no mutual interference, and so that the photosensitive material applied to the substrate for exposure is not stimulated. As an example, the wavelength $\lambda_1$ of the exposure beam might be selected to be 700 nm, and the wavelengths $\lambda_2$ and $\lambda_3$ for measurement to be 750 nm and 800 nm.

Principle of Recording and Reproduction

Below the principle of recording and reproduction of the holographic exposure method of the next aspect is explained. Similarly to reproduction, recording onto a hologram mask is possible using the reflection type holographic exposure device 100 of this aspect.

In exposure by means of so-called photolithographic techniques, light from a reticle pattern formed on a mask is made to form an image on photosensitive material by lenses or similar, and the state of distribution of the optical intensity of the image (the square of the light amplitude) is recorded. By means of this method, reticle amplitude information, which is brightness information, is recorded without modification on the photosensitive material, but on the other hand, phase information indicating spatial positions cannot be recorded. In contrast, using the holography exposure technique employed in this aspect, light from the reticle (object light) and light emitted from the same light source and directly reaching the photosensitive material (reference light) are caused to interfere, and the intensity distribution of interference fringes is recorded on the hologram mask. Hence in addition to brightness information, phase information is also contained in the intensity distribution of interference fringes recorded on the hologram mask, and the state of light waves from the object can be nearly completely recorded in the photosensitive material.

Figure 2A:
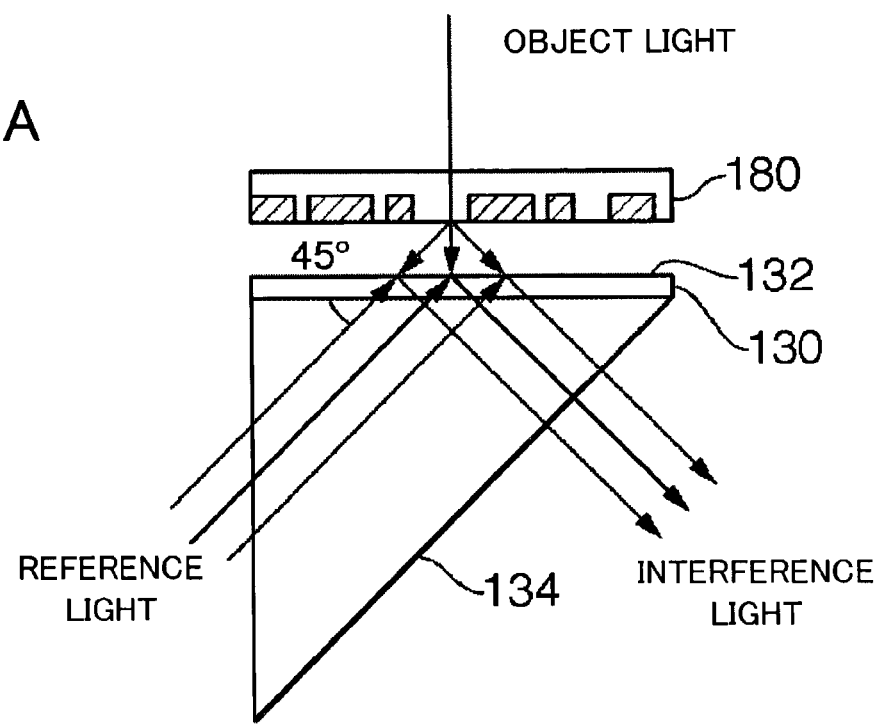
FIG. 2A explains processing for recording onto a hologram mask, and FIG. 2B explains processing for reading from a hologram mask to a photosensitive material film.

First, the principle of recording in such reflection type holographic exposure technology is explained, referring to FIG. 2A.

When recording a pattern, the original reticle 180 corresponding to the mask on which the pattern is drawn is positioned opposing the hologram mask on one face of the prism, and object light and reference light containing pattern information, which has passed through the original reticle 180, is emitted so as to interfere at the hologram recording surface. In other words, as shown in FIG. 2A, while object light is caused to pass through the original reticle 180 and be incident on the hologram recording surface 132, reference light from behind the hologram recording surface 132 and passing through the prism 134 undergoes total internal reflection at 45° and is also incident on the hologram recording surface 132. This object light and reference light result from splitting light emitted from the same light source using a beam splitter or similar. The object light is diffracted upon passing through the original reticle 180, and this diffracted light interferes with the reference light and is recorded as an interference pattern on the hologram recording surface 132. The interference fringes resulting from this interference are recorded in a layer in the thickness direction of the photosensitive material forming the hologram recording surface 132, and interference fringes are formed in the direction of the bisector of the angle made by the crossing of the object light and reference light. In this way, a hologram pattern is recorded. In this aspect, it is assumed that pattern information has already been recorded in the hologram mask 13 by means of the above recording process.

Figure 2B:
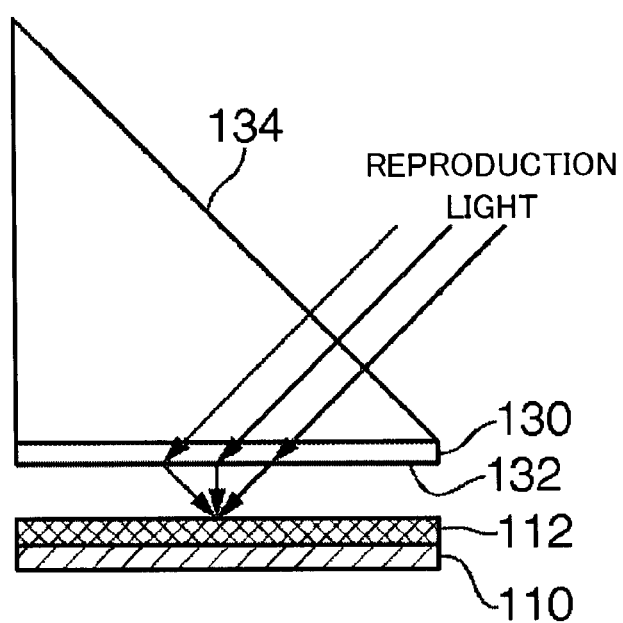

Next, the principle of reproduction in reflection type holographic exposure technology is explained, referring to FIG. 2B.

When reproducing the pattern, that is, during the exposure of the photosensitive material film which is the purpose of the high-resolution exposure, a substrate for exposure 110 on which is formed a photosensitive material film 112 is positioned in the same position as the original reticle 180, and reproduction light is emitted in the direction opposite that during recording. Through the emission of reproduction light, strong wavelength selection according to the so-called Bragg diffraction conditions occurs, in which only light at particular incidence angles and particular wavelengths is strongly diffracted according to the interference fringes (hologram pattern) recorded in a layer in the hologram recording surface 132. The mask pattern of the original reticle is reproduced to form an image within the photosensitive material film 112 on the substrate for exposure 110, and exposure takes place according to this pattern. This invention relates to improvement of the exposure technique during reproduction of this pattern information.

Overall Operation

Figure 3:
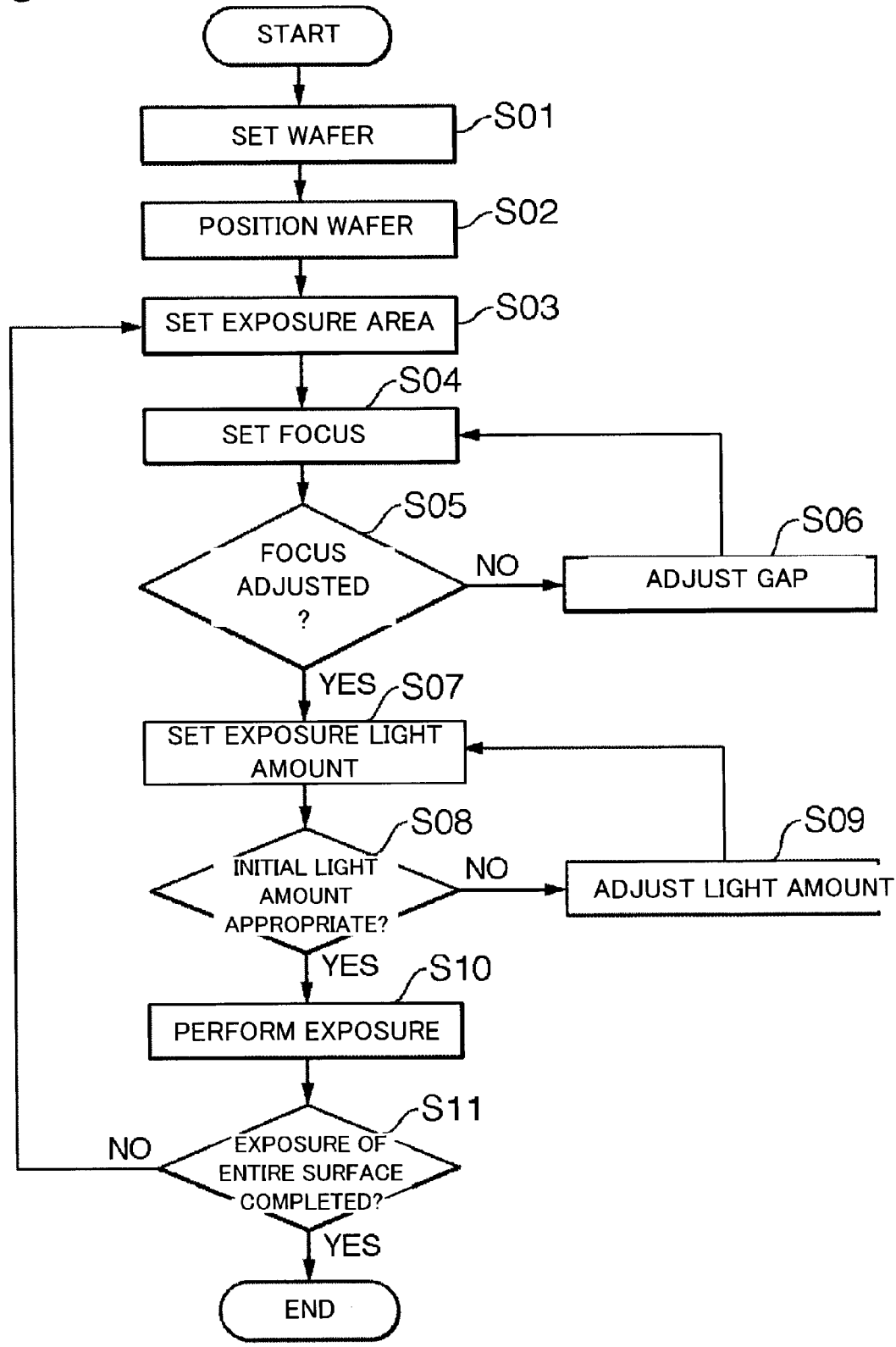
FIG. 3 is a flowchart explaining the operation of the holographic exposure process in the first embodiment.

Next, all processes of holographic exposure processing in this aspect are explained, based on the flowchart of FIG. 3. This exposure processing is based on the above-described reproduction principle.

It is assumed that a photosensitive material film 112, in which resist or other photosensitive material is applied to a wafer which is the substrate for exposure 110 which will be exposed, has been formed in advance. After placing this wafer on a stage device (S01), the wafer is positioned, referring to a reference mark drawn in advance on the wafer (S02), and the initial conditions for exposure are set (S03).

First, focus confirmation is performed to determine whether exposure light from the exposure light source 140 is correctly brought to a focus at the reference mark (S04), and if the light is not focused at the reference mark ("No" in S05), the gap between the hologram recording surface 132 and the surface of the photosensitive material film 112 is adjusted using the focusing servo mechanism of this invention (S06). So long as the light is not focused ("No" in S05), this gap adjustment is repeated (S04 to S06). The gap set in this way becomes the reference value for subsequent scanning exposure conditions.

On completion of gap adjustment ("Yes" in S05), in order to determine the amount of exposure light at the reference mark, the processing of this aspect to measure the thickness of the photosensitive material film and to control the amount of exposure light is used to measure the thickness of the photosensitive material film at the place in question, and the amount of exposure light is determined so as to obtain the desired exposure depth (S07 to S09).

After the gap and the amount of exposure light are set, exposure is performed at the reference mark (S10), and then the exposure light source position is set so as to irradiate the area to be exposed next, and the exposure area is set.

Subsequently, the above procedure is repeated, and when all the areas scheduled [for exposure] have been exposed ("Yes" in S11), the exposure process is ended.

Next, measurement of the distance between the hologram recording surface and the photosensitive material film, and operation of the focusing servo (S04 to S06), in this invention are explained in further detail.

First, in order to understand problems with the holographic exposure of the prior art, the shallowness of the depth of field in holographic exposure, and the need for multiple exposure arising from this shallowness of depth of field, are explained.

Figure 13:
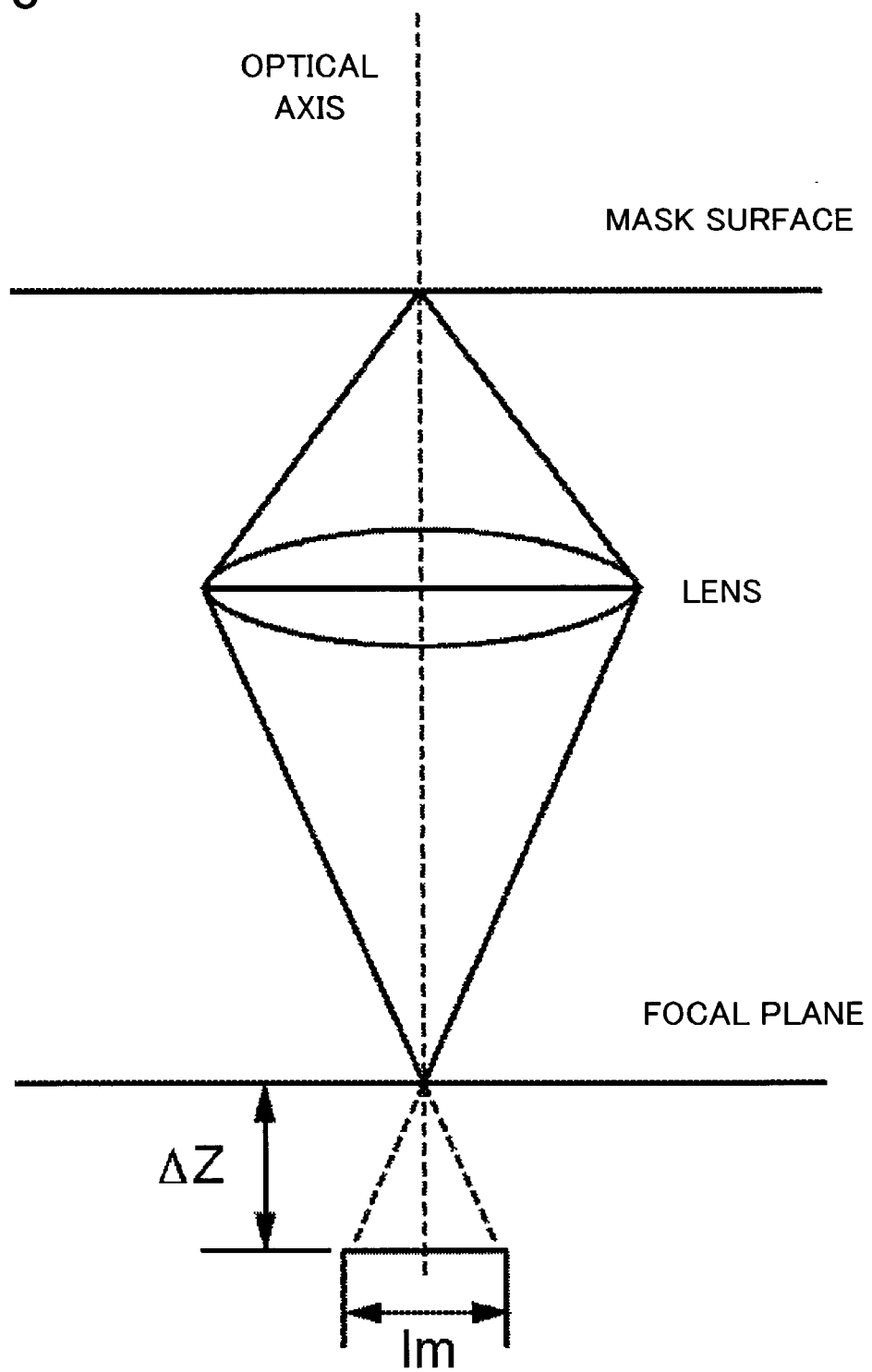
FIG. 13 explains in summary the resolution (lm) and focal depth (ΔZ) in a projection optical system.

FIG. 13 explains in summary the resolution (lm) and focal depth ($\Delta Z$) in a projection optical system.

In general, the resolution (lm) in a projection exposure optical system, which is the minimum line width that can be formed in a pattern, is given by $$lm = k \cdot (\lambda/NA)$$

where the coefficient k is from 0.6 to 0.7, $\lambda$ is the light wavelength, and NA is the numerical aperture (brightness) of the lenses used in the optical system.

In the case of holographic exposure, in principle exposure is performed without using lenses; hence the above aperture ratio is not determined by the characteristics of lenses, but by the positional relationship of the hologram mask to the substrate for exposure, and by the angle of incidence of reproduction light on the hologram recording surface. For example, if the interval between the hologram mask and substrate for exposure is approximately 100 μm, and the angle of incidence of the reproduction light is 45°, then the aperture ratio is approximately 0.8. This value is large compared with the aperture ratio of approximately 0.68 for lenses used in ordinary stepper optical systems, and indicates that the optical system is bright, and that when light of the same wavelength is used for exposure, exposure is possible at a higher resolution than in exposure using an ordinary stepper.

On the other hand, the focal depth ($\Delta Z$) is given by $$\Delta Z \approx \pm n\lambda/2(NA)^2$$

so that the larger the NA, the smaller is the focal depth. That is, a characteristic of holographic exposure is that while the resolution is high compared with ordinary mask exposure, the focal depth is shallow.

A shallow focal depth means that the depth-direction range within which sufficient optical energy for sensitization of the photosensitive material film, during exposure at a desired resolution, is shallow. Hence when a pattern has already been formed on the substrate for exposure, which has depressions and protrusions in the surface, the desired exposure cannot be completed in a single exposure pass, and the need arises for multiple exposures to be performed, in which the focus position is changed in the depth direction. That is, in order to raise the resolution of the resist image in the photosensitive material film, the film thickness must be reduced; but when there are already depressions and protrusions in the substrate for exposure as a result of formation of such patterns, the resist must be made thicker in order to even out the depressions and protrusions, with the result that the resolution is lowered. The multiple exposure using multi-layer resist of the prior art was performed in order to improve this situation.

Figure 14A:
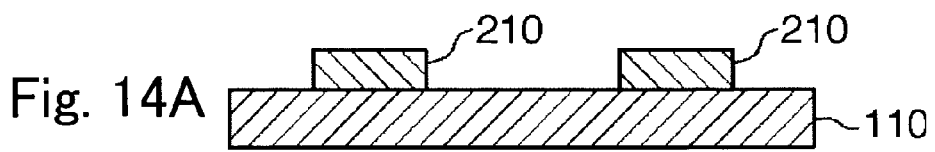
FIG. 14A through FIG. 14F are cross-sectional views of manufacturing processes explaining a method of the prior art, and explain processes in the case when a three-layer resist method is used to perform multiple exposure on a substrate the surface of which has depressions and protrusions.

The conventional multiple exposure method is shown in summary in FIG. 14A through FIG. 14F. As shown in FIG. 14A, the pattern 210 is already formed on the substrate for exposure 110, and multiple exposures are performed in order to form the pattern 261 shown in FIG. 14F on top of this pattern.

Figure 14B:
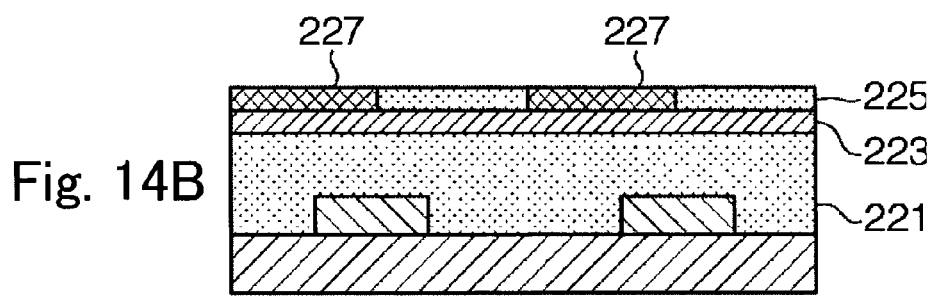

First, as shown in FIG. 14B, a several-micron-thick resist 221 is applied to even the depressions and protrusions in the surface of the substrate for exposure 110, and bury any steps. A submicron-thickness $SiO_2$ film 223 is made to adhere on top of this, and on top of this a thin (submicron-thickness) resist 225 is applied. The thick resist film 221 applied on the bottom is employed to make the surface smooth; the uppermost resist layer 225 is employed to obtain high resolution.

Figure 14C:
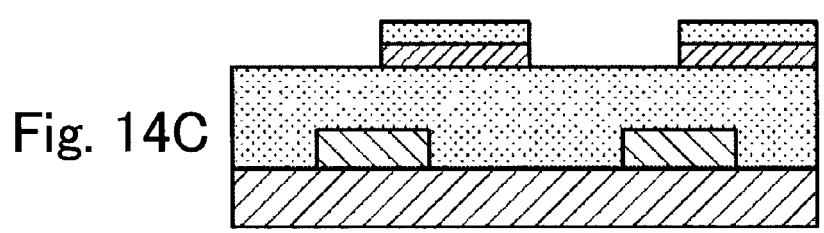
Figure 14D:
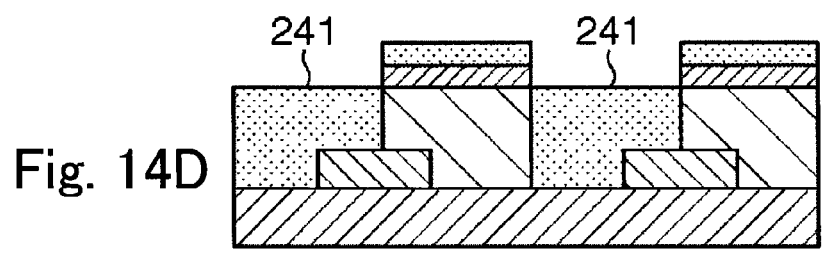
Figure 14E:
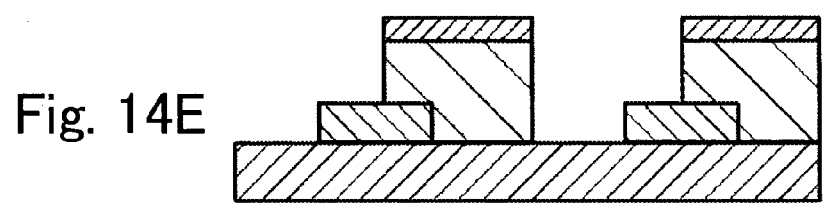
Figure 14F:
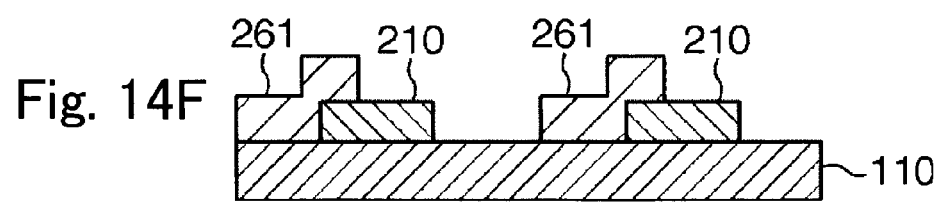

In this state, a single exposure is first performed (FIG. 14B), and after removing the resist 227 in the exposed portions, reactive ion etching is used to remove the $SiO_2$ film 223 (FIG. 14C). A second exposure of the underlying thick resist film 221 is then performed (FIG. 14D). Then the exposed portion of the resist 241 is removed (FIG. 14E), and after forming a pattern 261 for the purpose of metal evaporation deposition or similar, the thick resist film portion is removed (FIG. 14F).

In this way, in the multiple exposure method of the prior art employing multi-layer resist, complex processes in numerous stages were required in order to maintain pattern precision.

On the other hand, in this invention, by means of the focusing servo described below, an appropriate distance from the exposed surface is always maintained according to the depressions and protrusions in the surface of the photosensitive material film, so that even if a pattern is formed and there are depressions and protrusions in the surface, multiple exposures or other complex processes are not required. Below, the focusing servo configuration is explained.

Figure 4:
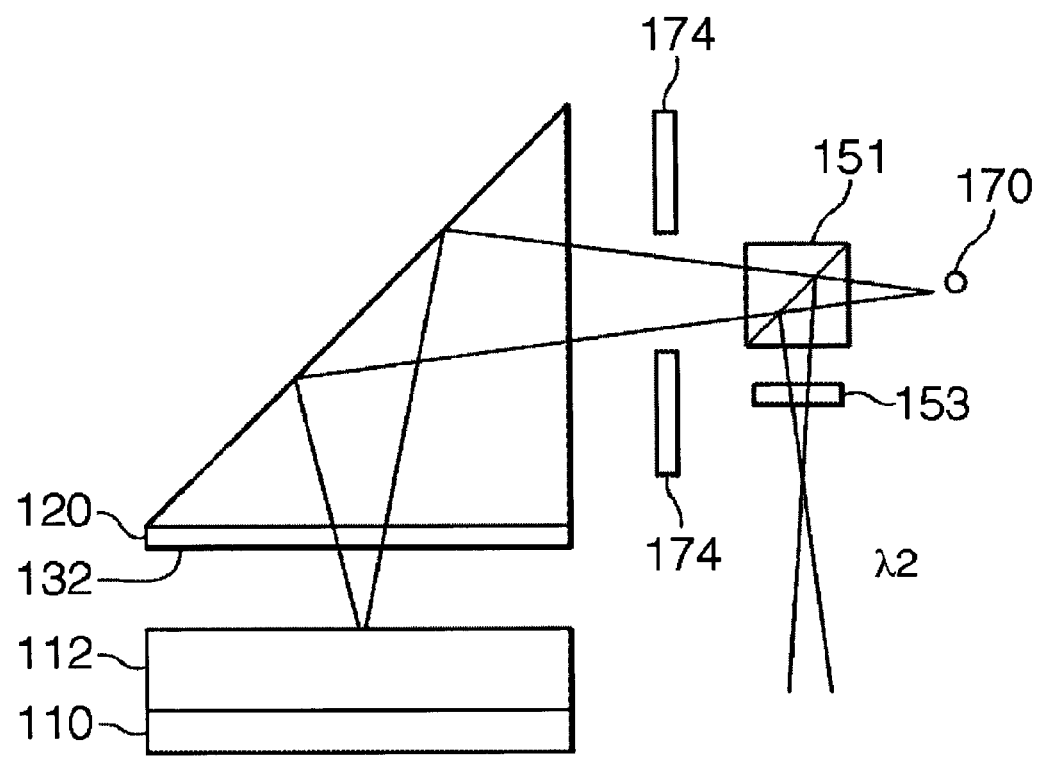
FIG. 4 explains the focus adjustment mechanism used in the holographic exposure device of the first embodiment.

As shown in FIG. 4, the measurement beam emitted from the measurement light source 170 passes through the apertures 172 and 174 and is reflected by the prism 134, and is incident normally on the hologram recording surface 132 and on the surface of the substrate for exposure 110. This measurement beam is reflected by hologram recording surface 132, by the surface of the photosensitive material film 112, and by the interface of the photosensitive material film and the substrate for exposure 110. The reflected measurement beams of wavelengths $\lambda_2$ and $\lambda_3$ pass through the same optical path as on incidence, but in the opposite direction, and are emitted from the prism 134.

These reflected measurement beams are reflected by beam splitters 151 and 161, prepared for the respective wavelengths $\lambda_2$ and $\lambda_3$, to change the optical paths, and are guided to the film thickness measurement device 160, which is an optical system for measurement of the thickness of the photosensitive material film, and to the distance measurement device 150, which is an optical system used to measure the distance between the photosensitive material film surface and the hologram recording surface.

The measurement beam with wavelength $\lambda_2$ is used by the focusing servo in the distance measurement device 150. That is, the measurement beam with wavelength $\lambda_2$ is reflected by the beam splitter 151, passes through the cylindrical lens 153 and is incident on the optical sensor 154, and an error signal formed by the error signal detector 155 is sent to the PC 152.

In this aspect, a focusing servo mechanism employing astigmatism is adopted for focusing servo processing. Error signal processing utilizing astigmatism is explained below, referring to FIGS. 5A and 5B.

As explained above, the measurement beam with wavelength $\lambda_2$ is emitted from the measurement light source 170, passes through the hologram recording surface 132, is reflected at the surface of the photosensitive material film 112, and is reflected by the beam splitter 151 of the distance measurement device 150, to be guided to the cylindrical lens 153.

Figure 5A:
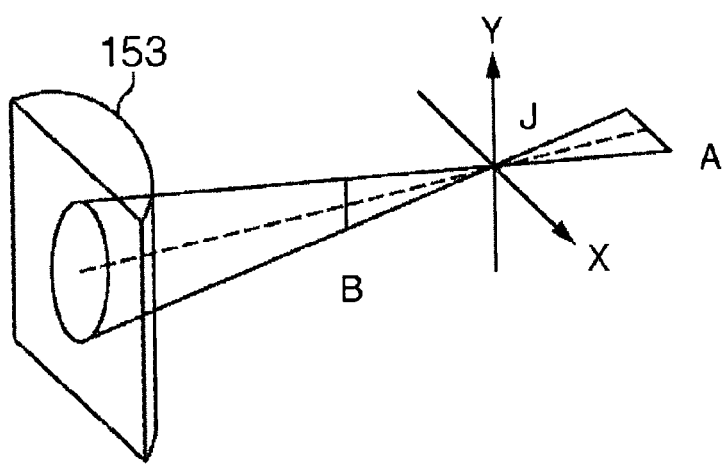
FIG. 5A explains the manner of convergence in a cylindrical lens.
Figure 5B:
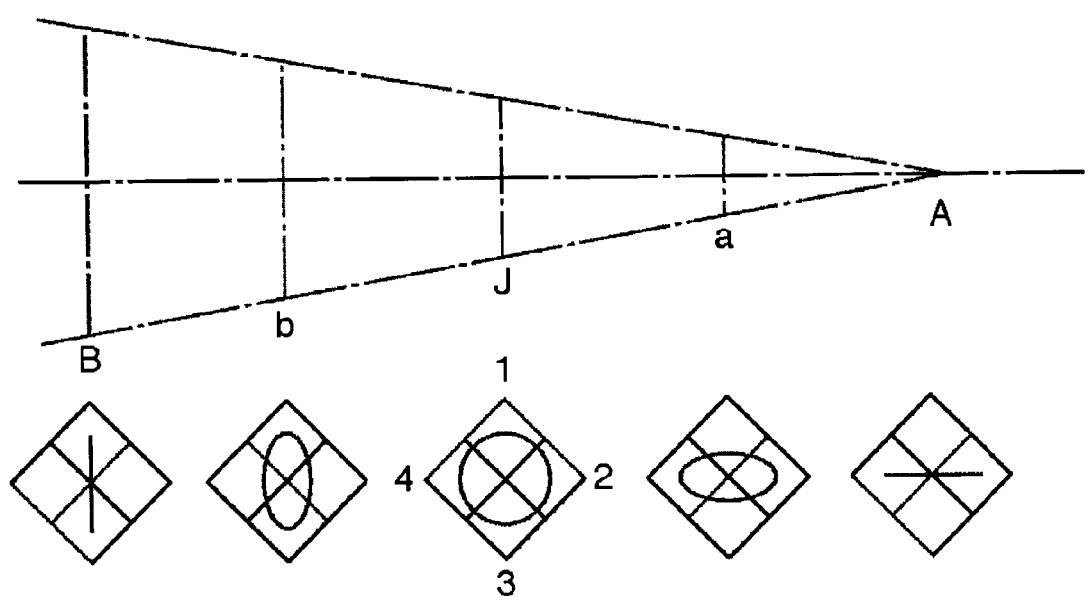
FIG. 5B shows the relation between distances in the cylindrical lens and condensed shapes.

The cylindrical lens is a lens in a half-cylinder shape, and is configured to act as a condensing lens with respect to components in one direction among the directions orthogonal to the optical axis of incident light (for example, in FIG. 5A, the X direction), but does not act on components in directions different from this (for example in FIG. 5A, the Y direction which is perpendicular to the X direction). The measurement beam reflected by the beam splitter 151 converges on the point A in FIG. 5 when not acted on by the aperture 174. Hence at the point A, the Y-direction component of the measurement beam converges to become a single line parallel to the X-axis direction. On the other hand, the X-direction component strongly converges due to the action of the cylindrical lens 153, and the measurement beam becomes a single line parallel to the Y axis at the point B. The position of the cylindrical lens 153 is adjusted such that, when the reflecting surface of the photosensitive material film is at a prescribed distance, the condensed shape such as in FIG. 5B occurs at the point J, and an optical sensor 154 is placed at this point J. The optical sensor 154 is divided into fourths, and is adjusted such that the center point is positioned at the point J.

In such a configuration, the measurement beam, having passed through the cylindrical lens, is incident on the optical sensor 154. The sensor areas into which the optical sensor 154 is divided each output an electrical signal corresponding to a portion of the area of the incident light beam. The error signal detector 155 performs operations based on the electrical signals from each of these divided sensor areas, and outputs the result as an error signal. The error signal detector 155 is combined with an operational amplifier, and, for example, computes the sums of the sensor areas on each of the diagonals of the optical sensor 154, and subtracts one sum from the other. For example, if as in FIG. 5B signs are assigned to the sensor areas of the optical sensor, then the error signal is computed as:

Error signal=(output of area 4+output of area 2)−(output of area 1+output of area 3)

Figure 6A:
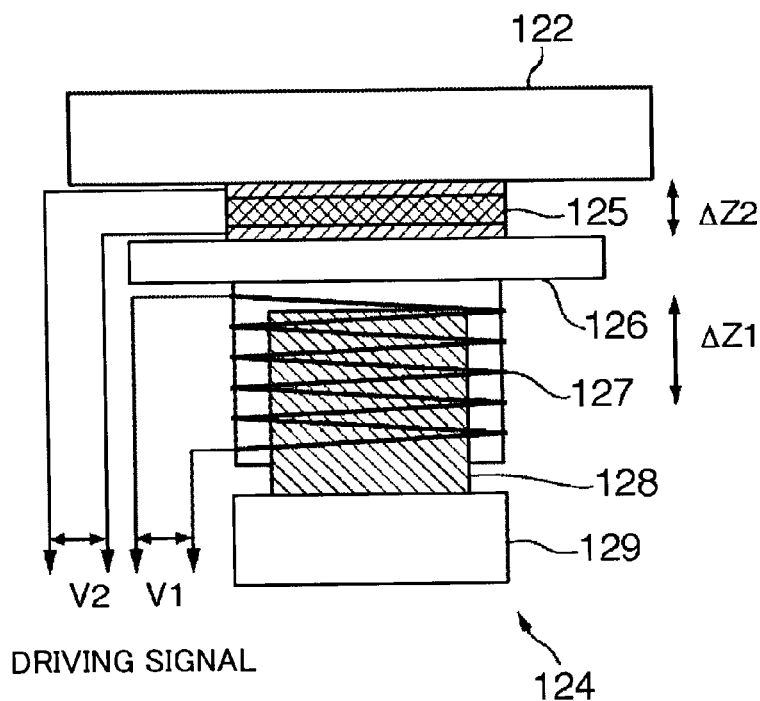
FIG. 6A is a drawing of the detailed configuration of a stage device, which is a focusing servo driving device.
Figure 6B:
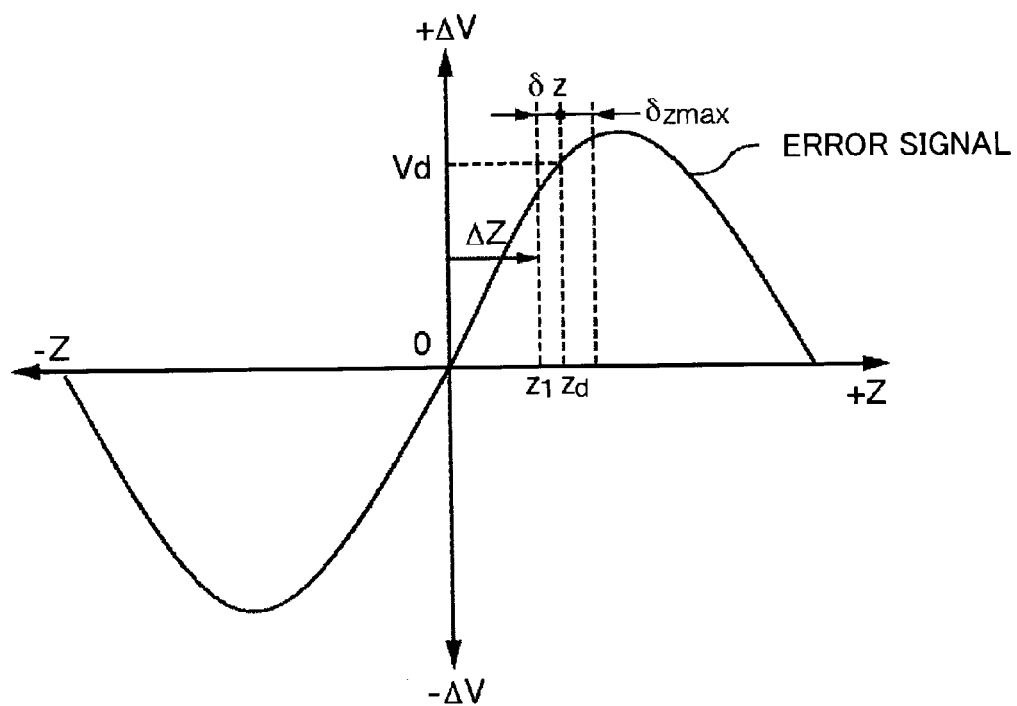
FIG. 6B is an example of an error signal, used in explaining a two-stage adjustment mechanism.

FIG. 6B shows an example of an error signal output from the error signal detector. According to the above computations, when the surface of the photosensitive material film is positioned in the focal plane of the optical system, that is, when exactly in focus, the spot shape of the measurement beam detected by the optical sensor 154 will be a true circle, and the error signal will be zero (Z is zero at the origin). On the other hand, if the photosensitive material surface is above or below the focal plane, that is, if the focus is shifted from the appropriate value, the spot shape of the detected measurement beam will deviate from a true circle, and will be extended either vertically or horizontally (the shape of the positions a or b in FIG. 5B), the areas of portions of the spot will change, and according to the above computations, a positive or negative error signal will be generated. The PC 152 takes this error signal as input, and when the above error signal shifts from zero, a driving signal is output so as to move the Z position of the stage in the direction so as to make the error signal zero, to adjust the focus control.

As shown in FIG. 6A, more specifically, the stage device 124 comprises a base 129, permanent magnet 128, tube-shape coil 128, partition 126, and piezoelectric element 125. The permanent magnet 128 and tube-shape coil 127 correspond to the first adjustment mechanism in this invention, to perform coarse adjustments; the piezoelectric element 125 corresponds to the second adjustment mechanism in this invention, to perform fine adjustments.

The tube-shape coil 127 of the first adjustment mechanism has electrical wire wound a prescribed number of times about a tube-shape member which applies a magnetic force, and is fixed to the partition 126. The permanent magnet 128 is fixed to the base 129, and is inserted into the hollow core within the tube-shape coil 127, as a core magnet. By means of this configuration, the first adjustment mechanism is configured so as to cause the tube-shape coil 127 to float with respect to the permanent magnet 128 by means of the interaction between the magnetic force of the permanent magnet 128, and the magnetic force arising from the current flowing in the tube-shape coil 127. That is, the first adjustment mechanism is configured similar to the voice coil of a speaker, and can move in the Z direction by a displacement $\Delta Z$ (of micron order) corresponding to a current flowing in response to a voltage V1 applied across the two ends of the tube-shape coil 127.

The piezoelectric element 125 of the second adjustment mechanism has a construction in which a ferroelectric ceramic with piezoelectric properties, of PZT or similar, is enclosed between electrodes, and undergoes strain according to a voltage applied across the electrodes. The piezoelectric element 125 is formed in layers from the lower electrode, which is one of the electrodes, on top of the partition 126, of silicon or similar; the upper electrode, which is the other electrode, is fixed to the stage 122. By means of this configuration, the piezoelectric element 125 can be made to cause a displacement in the Z direction of the stage 122 with respect to the partition 126, by a minute amount δz (of submicron order), by applying a voltage V2 across the electrodes.

Because the entirety of the piezoelectric element 125 which is the second adjustment mechanism is placed on top of the tube-shape coil 127, which is the first adjustment mechanism, the total displacement is the sum of the displacement ΔZ due to the first adjustment mechanism, and the displacement δz due to the second adjustment mechanism. For example, in FIG. 6B, suppose that because the focus is shifted, an error signal with voltage Vd is output, corresponding to a position such as that of zd. The PC 152 can recognize, through the voltage Vd of the error signal, that the current focus is shifted by an amount zd. When this shift exceeds the adjustable range δz of the piezoelectric element 125 which is the second adjustment mechanism, the PC 152 first outputs a voltage V1 as a driving signal to drive the first adjustment mechanism, to perform coarse adjustment. By means of this driving signal, a current flows in the tube-shape coil 127, the partition 126 moves by a displacement ΔZ (=z1) corresponding to the current, and the stage 122 is sent to the vicinity of the position at which the focus shift is cancelled. When this coarse adjustment by the first adjustment mechanism is completed, the PC 152 detects another error signal, and outputs a voltage V2 as a driving signal necessary for fine adjustment. The piezoelectric element 125 undergoes strain corresponding to this voltage V2, and as a result the stage 122 is fine-adjusted by a minute displacement δz which cannot be provided by the first adjustment mechanism. Through such interaction of the coarse adjustment of the first adjustment mechanism and the fine adjustment of the second adjustment mechanism, focusing servo operation is performed, accurately and with a short response time, until the error signal becomes zero.

Operations by the PC 152 may be performed by maintaining error signals in a data table, or, approximating calculations may be performed. Similar functions are achieved by using analog signal feedback as well.

The coarse adjustment of the first adjustment mechanism and fine adjustment of the second adjustment mechanism may be performed simultaneously, or may be performed with a time difference.

Through the above operations, no matter what the exposure position of the scanning exposure light, the interval between the hologram mask recording surface 132 and the surface of the photosensitive material film 112 can be held constant, so that the exposure conditions can be made constant over the entire surface for exposure.

Figure 7A:
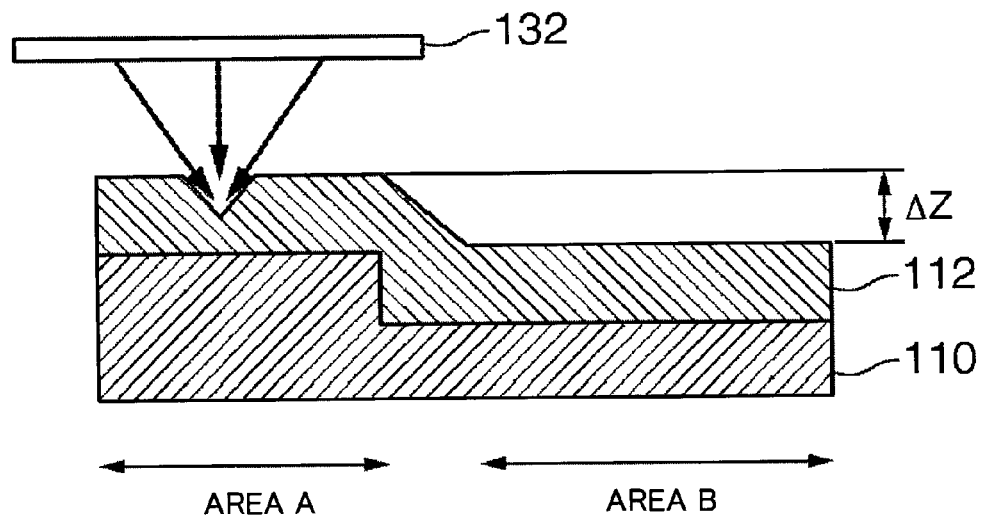
FIG. 7A and FIG. 7B are drawings explaining movement of the substrate for exposure in the Z direction when exposing a photosensitive material film having depressions and protrusions.
Figure 7B:
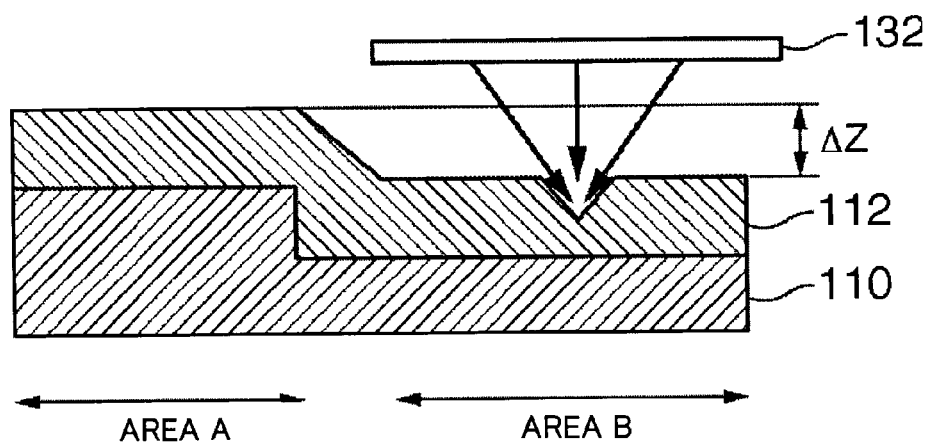
Figure 8:
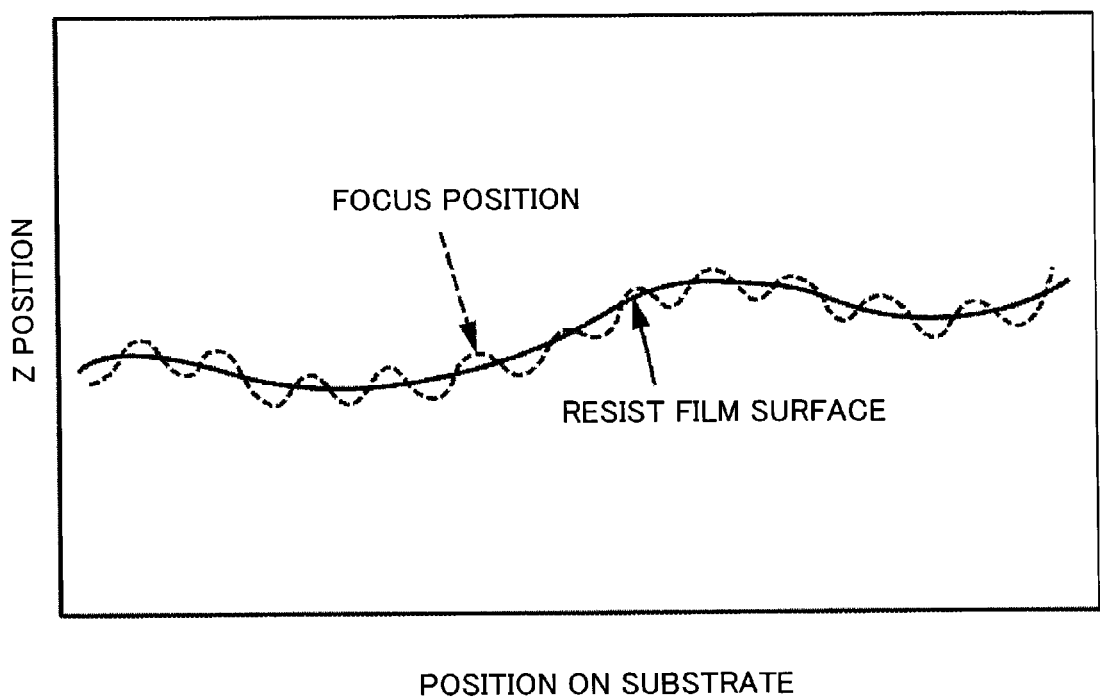
FIG. 8 is a drawing showing the position in the Z direction of the substrate for exposure relative to the plane position when exposing a photosensitive material film having undulations, and showing the fluctuations in the focus position.

For example, suppose that there exist depressions and protrusions in the substrate for exposure 110 which is to be exposed, as shown in FIG. 7A, and that steps of height ΔZ occur in the surface of the photosensitive material film. In the relatively high area A of the photosensitive material film, if the focal plane position of the optical system and the position for exposure of the photosensitive material film are made to coincide and exposure is begun, the distance between the surface of the photosensitive material film 112 and the hologram recording surface 132 is maintained appropriately by the focusing servo of this aspect. By performing scanning exposure in this state, as shown in FIG. 7B, even when the exposure light moves to the relatively low area B, the focusing servo of this aspect causes the stage device 120 to be moved in the Z direction by the amount of the step ΔZ to adjust the height of the substrate 110, so that a pattern can be formed in positions at different heights from the substrate surface, all in a single exposure scan pass. The above exposure process is performed over the entirety of the substrate for exposure, having depressions and protrusions in the surface, while scanning the exposure beam over the substrate for exposure; the focal position of the exposure beam changes according to changes in the height (Z position) of the resist film surface on the substrate receiving the scanning exposure light, and changes in the focal position on the substrate include, for example, periodic fluctuations as shown in FIG. 8.

A more specific example of a substrate exposure process is shown in the manufacturing process cross-sectional views of FIG. 9A through FIG. 9E. As with the explanation of the multiple exposure method in FIG. 14, the pattern 261 which is ultimately to be formed overlaps a pattern 210 formed in advance.

Figure 9A:
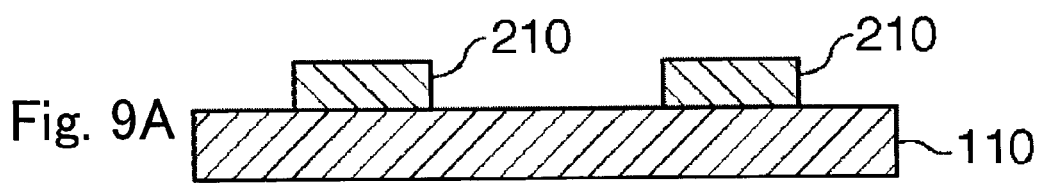
Figure 9B:
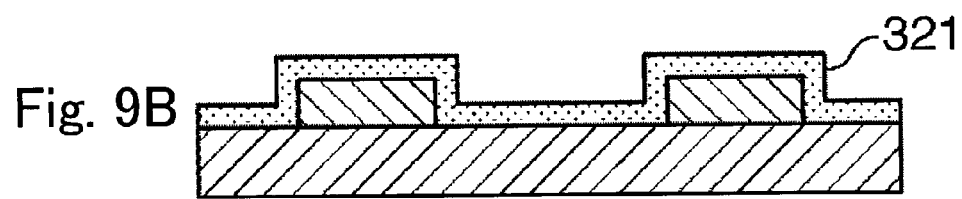

As shown in FIG. 9A, in order to raise the resolution, a thin resist film 321 is applied onto the substrate for exposure 110, on which a pattern 210 is already formed (FIG. 9B). The applied resist film 321 differs from resist used in multiple exposure (see 221 of FIG. 14B), and is applied in such a way that the protrusions and depressions of the pattern on the substrate are reproduced essentially without change.

Figure 9C:
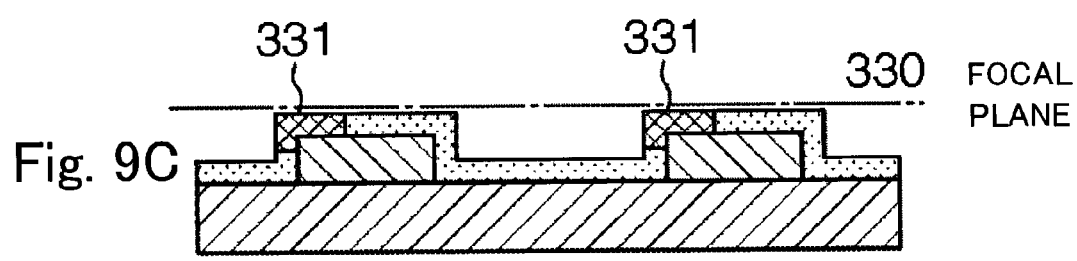
Figure 9D:
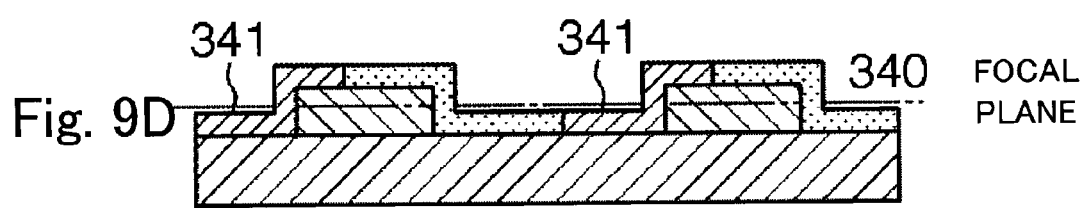
Figure 9F:
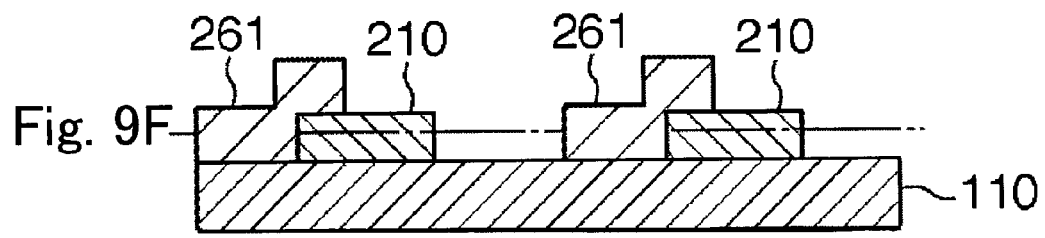

In order to obtain the pattern 261 that is ultimately to be formed, exposure must be performed spanning the steps due to the pattern 210 in the above resist 321. At the hill portions of the resist film 321, exposure is performed with the focal plane 330 of the exposure optical system in a state patching the hill portion of the resist film 321, through [the action of] the focusing servo. As a result, the resist 831 is exposed from the surface of the hill part of the resist film 321 to the depth equivalent to the focal depth of the optical system (FIG. 9C). When, in this state, the exposure light moves to a valley portion of the resist film, the stage position is adjusted by the focusing servo until the focal plane 340 of the exposure optical system coincides with the valley portion, and the resist 841 is exposed from the surface of the valley portion of the resist film 321 up to the depth equivalent to the focal depth of the optical system (FIG. 9D). In this way, in a single exposure pass, resist is exposed on the step portions of a pattern formed in advance. After removing the exposed resist film 331 and 341 and performing metal evaporation deposition or similar, if the exposed resist is removed, the desired pattern 261, such as that of FIG. 9E, is obtained by means of a single exposure pass.

Thus by means of the holographic exposure device of this invention, in contrast with the conventional multiple exposure method, even when depressions and protrusions are formed in advance on the substrate, the height of the focal plane of the optical system can be controlled by the focusing servo even with respect to the depressions and protrusions. Hence pattern formation is possible in a single exposure pass, with only a thin resist film applied, without detracting from the resist resolution.

Depending on the shape of the pattern, it is possible that steps in the surface depressions and protrusions in the photosensitive material film may be larger than the largest Z-direction displacements that can be tracked by the focusing servo. In such cases, Z-direction information corresponding to the exposure pattern may be stored in advance in a storage device, not shown, of the PC 152, and the focal plane of the exposure optical system moved substantially according to the height of the area for exposure, exercising control so as to extend the range that can be tracked by the focusing servo.

In the above aspect, a focusing servo employing an astigmatic method was employed; but other focusing servo methods may be used instead. For example, a Foucault method, in which light reflected from the photosensitive material film is focused at a vertex of a prism, and error signals are detected by two sensors divided in two, or a critical angle method, in which a critical angle prism is used to perform adjustments such that the incident angle is just at the critical angle with respect to the center ray of reflected light, and error signals are detected by two sensors. divided in two, may be employed.

Next, processing to measure the thickness of the photosensitive material film by the film thickness measurement device 160 and PC 162, as well as light amount control processing based on this, are explained.

As stated above, the measurement beam of wavelength $\lambda_3$, which is emitted from the measurement light source 170, reflected by the prism 134, and passes through the hologram recording face 132, is normally incident on the substrate for exposure 110. This incident light is reflected by both the surface of the photosensitive material film 112, and by the interface between the photosensitive material film 112 and the substrate for exposure 110, is guided to the beam splitter 161, the reflection direction is changed, and at the photodetector 163 is detected to become an electric signal, which is amplified to an amplitude suitable for A/D conversion by the amplifier 164; in the A/D converter 165, [the signal] is converted into a corresponding digital value, and is output to the PC 162 as a light detection signal.

Figure 10:
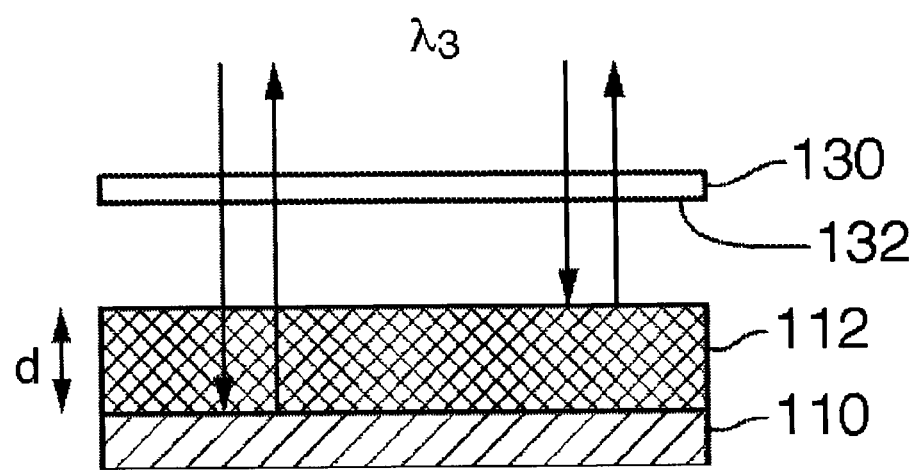
FIG. 10 explains the principle of measurement of the thickness of a photosensitive material film used in a holographic exposure device, in the first embodiment.

Here, as shown in FIG. 10, the reflected measurement beam includes a component reflected by the surface of the photosensitive material film 112, and a component reflected by the interface of the photosensitive material film 112 and the substrate for exposure 110; hence the reflected light actually incident on the photodetector 163 is an interference wave resulting from these two reflected beams. The path difference of these two types of reflected light corresponds to twice the thickness d of the photosensitive material film 112, so that the interference wave contains information arising from this path difference. Hence by analyzing the reflected light containing this interference information, the thickness of the photosensitive material film can be determined.

Specifically, if the energy reflectivity of the reflected light is R, the reflectivity is $R_p$, and the coherence of the two types of reflected light is K, then the following (1) is an approximating equation.

$$R_p \approx R(1+(1-R)^2 - 2(1-R)K\cos(2\Delta)) \quad (1)$$

Here $\Delta = (\pi/\lambda_3)\Delta L$, and $\Delta L = 2nd\cos(i)$, where n and d are respectively the refractive index and thickness of the photosensitive material film, and i is the refraction angle.

In this aspect, the incident light is incident perpendicularly on the photosensitive material film 112, so that the reflected light is also emitted perpendicular to the film, and so no refraction occurs, and the refraction angle i is zero. Hence $\Delta L$ simply becomes 2nd, and $\Delta = 2(\pi/\lambda_3)nd$, so that from eq. (1) the following is obtained.

$$R_p \approx R(1+(1-R)^2 - 2(1-R)K\cos(4\pi nd/\lambda_3)) \quad (2)$$

Hence the reflectivity $R_p$ fluctuates with the film thickness. The energy reflectivity R also changes with the film thickness, and so the reflectivity $R_p$ fluctuates periodically while decreasing as the film thickness increases.

Figure 11:
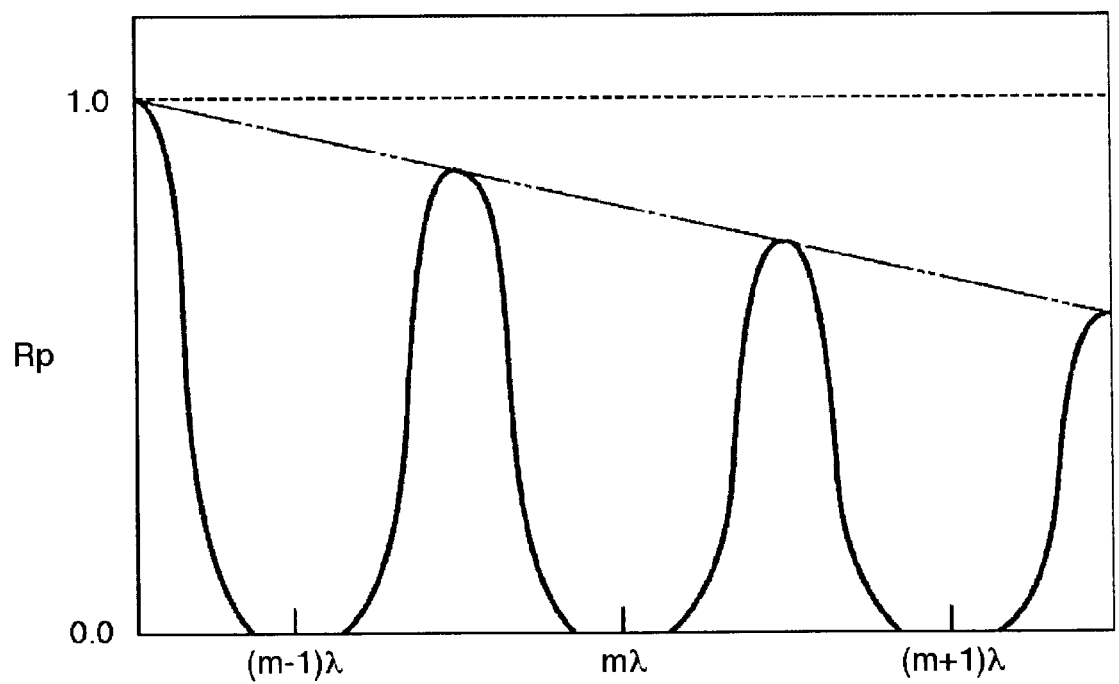
FIG. 11 explains the relation between film thickness and reflectivity of interference light during measurement of the thickness of a photosensitive material film, used in a holographic exposure device.

In order to illustrate the relation between film thickness and reflectivity $R_p$ indicated by eq. (2), FIG. 11 shows the relation between the path difference and reflectivity $R_p$, taking the film thickness (path difference) along the horizontal axis and the reflectivity $R_p$ along the vertical axis. As shown in FIG. 11, as the film thickness changes, the reflectivity fluctuates periodically according to changes in the film thickness corresponding to the wavelength $\lambda$, and the reflectivity declines with increasing film thickness. As a result, the approximate path difference is obtained by $R_p$ envelope detection output, and minute path differences are obtained accurately through the waveform values of this portion.

Hence by measuring the energy reflectivity R in advance using a standard sample of known thickness, and setting the conditions for film thickness measurements, the path difference, equivalent to twice the above film thickness, can be determined from the reflectivity $R_p$ obtained by reflectivity measurements of the substrate for exposure, and so the thickness of the photosensitive material film can be computed. Consequently the PC 162 measures the energy reflectivity R of a standard sample in advance, and sets the relation of eq. (2) as a data table or as an approximating equation in advance. Digital data corresponding to a reflectivity R input from the A/D converter 165 is referenced, and the film thickness corresponding to this reflectivity R can be read from the data table, or calculated based on the approximating equation.

In the above embodiment, light of a single wavelength is used to measure the film thickness; but if precise film thickness measurements are necessary, light at two wavelengths may be used.

In this case, a light source emitting light at wavelength $\lambda_3'$, slightly different from the wavelength $\lambda_3$ ($\lambda_3' = \lambda_3 + \Delta\lambda$), is also provided, and light reflected from the photosensitive material film is obtained from the same optical path as for the above-mentioned wavelength $\lambda_3$, and a wave combining the two is formed.

Figure 12:
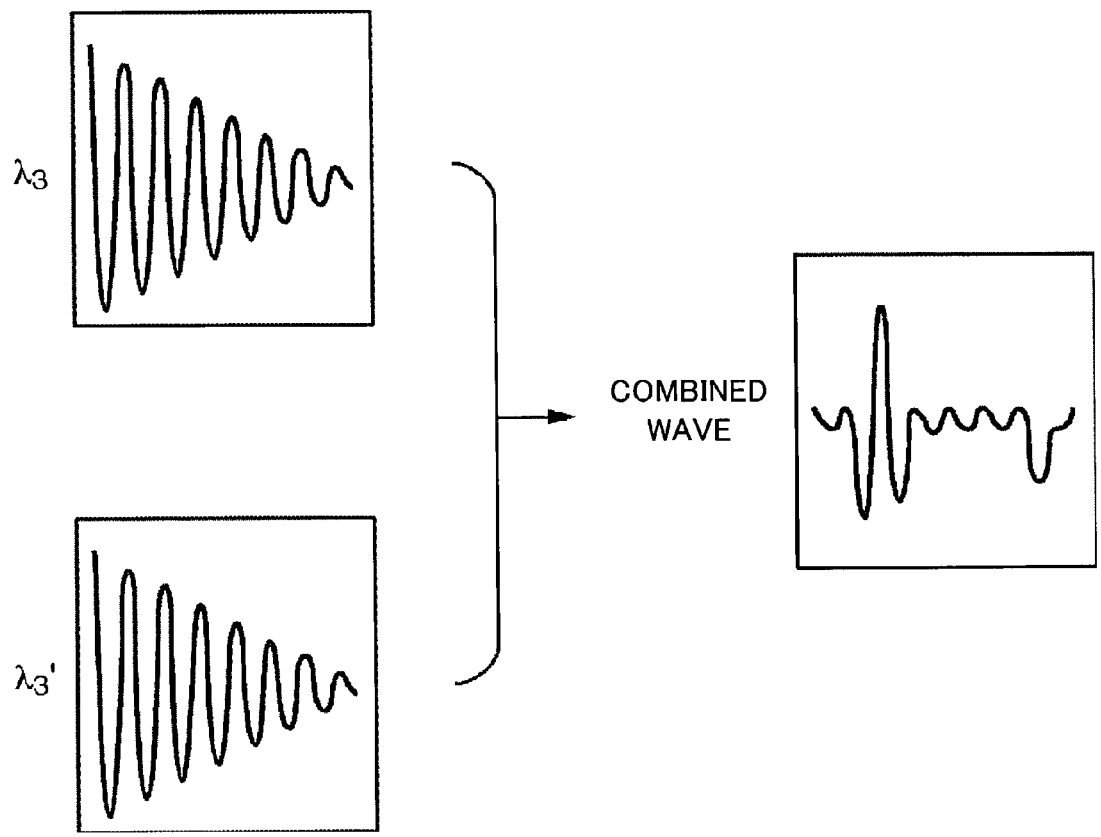
FIG. 12 explains the state of interference light when using light at a second wavelength in measurements of photosensitive material film thickness in a holographic exposure device.

Reflected light at wavelength $\lambda_3$ and reflected light at wavelength $\lambda_3'$ both contain information on the photosensitive material film thickness, and so the combined wave formed by combining these reflected light beams also contains information on the photosensitive material film thickness. The nature of the waveform of the combined wave appears in FIG. 12.

The reflectivity of the above combined wave is, from eq. (1), $$R_p \approx R(1+(1-R)^2 - 2(1-R)K\cos(2\Delta'))$$

Here $\Delta' = (\pi/\lambda_3)\Delta L'$, and $\Delta L' = 2\lambda_3 \Delta L/\Delta\lambda$, so that $$R_p \approx R(1+(1-R)^2 - 2(1-R)K\cos(8\pi nd/\Delta\lambda))$$

Here $\Delta\lambda$ is an extremely small quantity, so that the period of the above combined wave is extremely long, and the waveform is easily analyzed. As a result, through a technique which uses the above light at two wavelengths, film thickness measurements can be performed with higher precision than when using light at a single wavelength.

The PC 162 determines the appropriate amount of exposure light corresponding to the measured film thickness, and outputs to the exposure light source 140 a light amount control signal causing the appropriate amount of exposure light to be emitted. The relation between the thickness of the photosensitive material film and the appropriate amount of exposure light corresponding to the film thickness is set by the PC 162 using a data table based on measurements made in advance or using an approximating equation.

In the above, by means of the first embodiment, it is possible to exert control to hold constant the interval between the recording surface of the hologram mask 132 and the surface of the photosensitive material film 112, for any exposure position on the photosensitive material film; hence the effective focal depth of a holographic exposure optical system with a shallow focal depth can be increased, and the photosensitive material film applied onto a substrate for exposure having protrusions and depressions can be accurately exposed in a single exposure pass.

Second Embodiment

In a second embodiment of this invention, the holographic exposure technique explained in the above first embodiment is employed to manufacture thin film transistors.

In this aspect, the holographic exposure device of the above first embodiment is incorporated into a semiconductor manufacturing system, or is used as an exposure device in a semiconductor manufacturing system.

Figure 15:
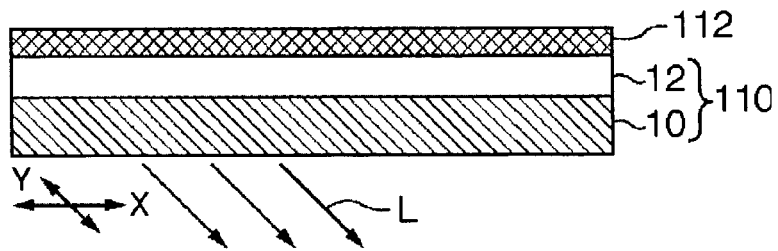
FIG. 15 is a cross-sectional view of manufacturing processes, showing an example of a method of manufacturing of semiconductor devices in a second embodiment.
Figure 15:
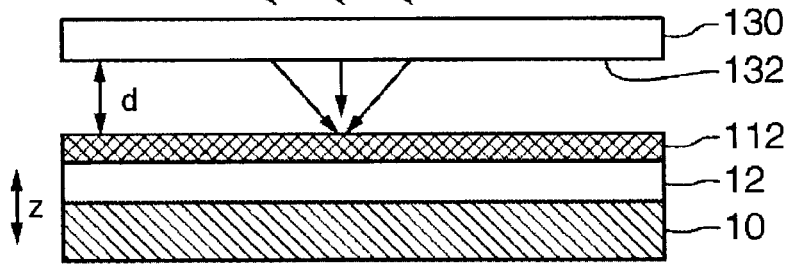
Figure 15:
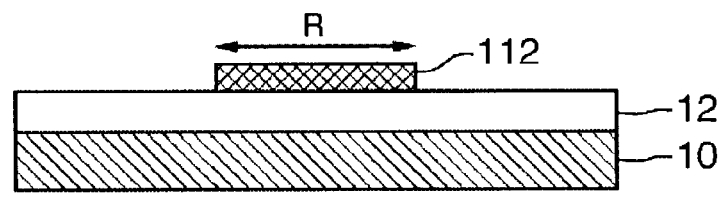
Figure 15:
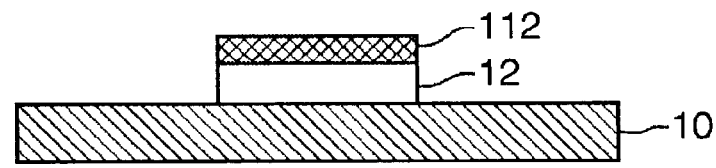
Figure 15:
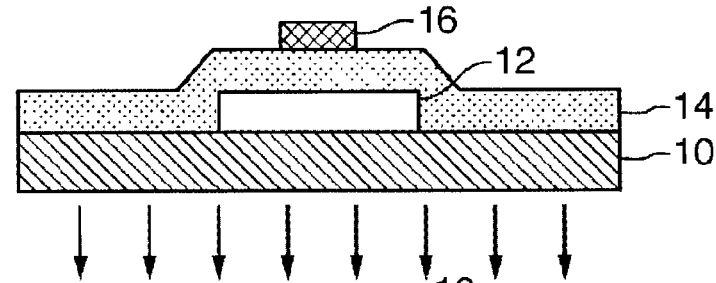
Figure 15:
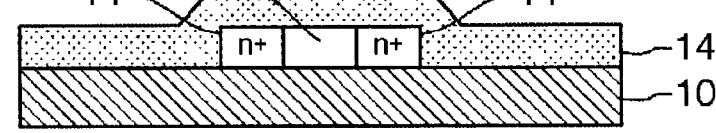
Figure 15:
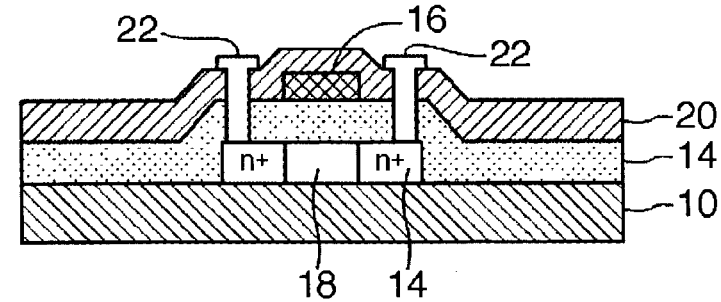

FIG. 15 is a cross-sectional view of manufacturing processes, as an example of a method of manufacture of thin film transistors.

First, as shown in ST20, a semiconductor film 12 is formed on a first substrate 10, which is an $SiO_2$ film or similar. The wafer itself corresponds to the first substrate 10. The semiconductor film 12 is formed by applying a well-known method, such as LPCVD. This first substrate 10 and semiconductor film 12 correspond to the substrate for exposure 110 in the above first embodiment. Next, a well-known resist material is applied onto the semiconductor film 12, to form the photosensitive material film 112. Spin-coating or another well-known application method is employed to apply the resist material.

Then, as shown in ST21, the photosensitive material film 112 is exposed by irradiation with reproduction light L in a holographic exposure device 100 to which the above first embodiment is applied. That is, a hologram mask 130 on which is recorded in advance the desired semiconductor film pattern information is positioned above the photosensitive material film 112, and the focal plane is set such that the distance between the hologram recording surface 132 and the surface of the photosensitive material film 112 is, for example, d. In this state, the exposure light source 140 is scanned to expose the entirety of the required area. At this time, by means of this invention, the amount of exposure light is controlled so as to be appropriate, and moreover a focusing servo moves the entire substrate in the Z direction so as to maintain a constant distance between the hologram recording surface 132 and the surface of the photosensitive material film 112, so that a high-resolution pattern image is formed over the entirety of the resist material.

As a result, by developing the resist material, the exposed area R is left on the semiconductor film 12 as shown in ST22.

By using this remaining resist as a mask to perform etching, the semiconductor film can be etched along the resist shape with high precision (ST23).

Next, as shown in ST26, an $SiO_2$ film 20 approximately 500 nm thick is formed by a prescribed method, such as PECVD, on the upper surface of the insulating film 14 and gate electrode 16. Then, contact holes are provided in the $SiO_2$ films 14 and 20 extending to the source/drain area 14, and a prescribed method such as sputtering is used to deposit aluminum or similar on the contact holes and the hole peripheries, to form the source/drain electrodes 22.

By means of the semiconductor device manufacturing method of this second embodiment, a single exposure pass is sufficient to accurately reproduce pattern information with high resolution on the resist and perform exposure using the exposure method of this invention, regardless of the existence of depressions and protrusions in the surface. Consequently the advantageous results of the exposure device and exposure method of the first embodiment are obtained. That is, even a semiconductor device configured with a high mounting density using a fine pattern can be patterned accurately and inexpensively at the scale and position of the original design.

Third Embodiment

A third embodiment relates to an electro-optical device comprising semiconductor devices or similar manufactured using the above exposure device or exposure method.

Figure 16:
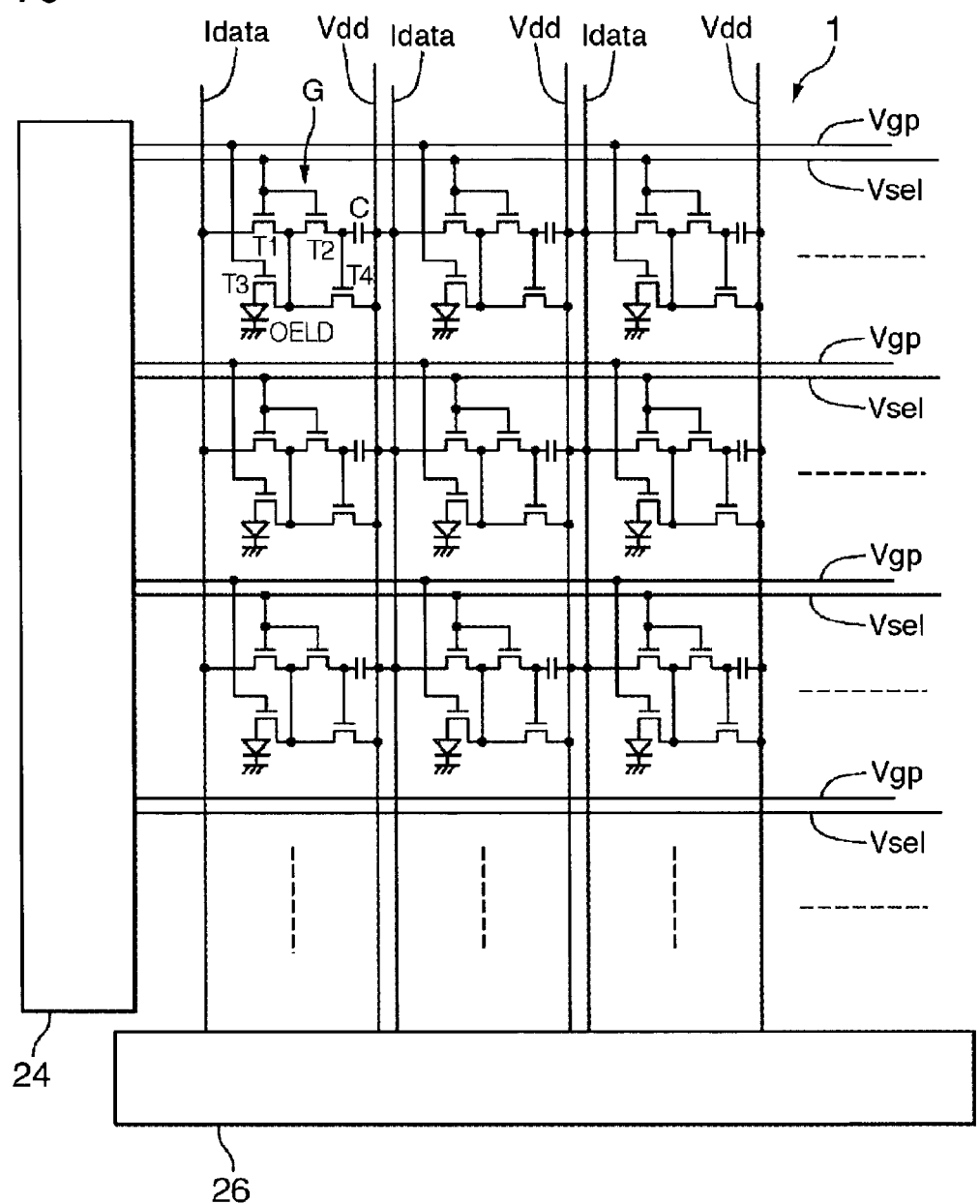
FIG. 16 is a circuit diagram showing one example of an electro-optical device in a third embodiment; and, FIG. 17 shows examples of application to electronic appliance in a fourth embodiment, where

FIG. 16 shows a diagram of connections in an electro-optical (display) device 1 of this third embodiment. The display device 1 of this aspect comprises an emission layer OELD capable of emission through an electric field light emission effect in each of the pixel areas G, and holding capacitors C which store current for driving the emission layer, as well as further comprising semiconductor devices manufactured by an exposure method of this invention, here comprising thin film transistors T1 to T4. A scan line voltage $V_{sel}$ and emission control line voltage $V_{gp}$ are supplied to each pixel area G from the driver area 24. From the driver area 26, a data line current $I_{data}$ and power supply line voltage $V_{dd}$ are supplied to each pixel area G. By controlling the scan line voltage $V_{sel}$ and data line current $I_{data}$, current to each pixel area G is programmed, and light emission by the light emission portion OELD can be controlled.

The above driving circuit is an example of a circuit for the case in which electric field light emission elements are used as the emission elements; other circuit configurations are also possible. By making various changes to the circuit configuration, liquid crystal elements can also be used as the emission elements.

Here each of the semiconductor devices provided in the pixel areas G of the display device 1 is fabricated by performing exposure and patterning using the exposure device and exposure method of the above-described first embodiment.

In this third embodiment, an exposure method of this invention is applied to the manufacture of semiconductor devices or similar in an electro-optical device, so that the advantageous results of the above first embodiment are obtained. That is, even in an electro-optical device with a fine pattern rule, in which the scale of fabrication of thin film transistors in pixel areas is minute, accurate high-resolution exposure in a single exposure pass can be performed by means of this exposure method. As a result the thin film transistor performance can be enhanced without increasing manufacturing costs.

Particularly when the display panel 1 employs a large-size panel and is formed on a substrate of comparatively great area, warping and undulations in the substrate occur. However, because the electro-optical device of this aspect is fabricated by means of holographic exposure using an exposure device and exposure method of this invention, by accurately tracking displacements in the substrate, there are few errors in patterning dimensions even when using holographic exposure which as a rule has a shallow focal depth.

Fourth Embodiment

A fourth embodiment of the invention relates to electronic appliance comprising semiconductor devices or similar manufactured using the above exposure device or exposure method. FIG. 17A through FIG. 17F show examples of electronic appliance of the fourth embodiment.

Figure 17A:
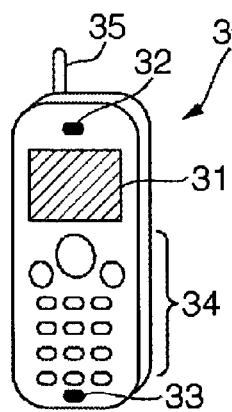
FIG. 17A is a portable telephone.

FIG. 17A is an example of a portable telephone in which is installed a semiconductor device or similar manufactured using an exposure method of this invention; the portable telephone 30 comprises an electro-optical device (display panel) 31, audio output unit 32, audio input unit 33, operation unit 34, and antenna unit 35. An exposure method of this invention is applied to the manufacture of semiconductor devices or similar provided in, for example, the display panel 31 or internal circuitry.

Figure 17B:
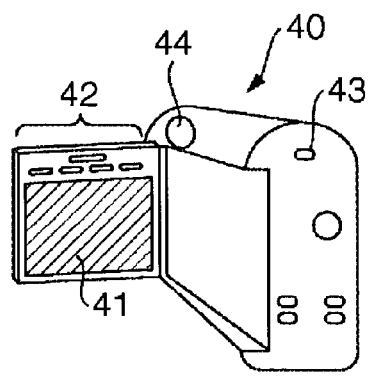
FIG. 17B is a video camera.

FIG. 17B is an example of a video camera in which is installed a semiconductor device or similar manufactured using an exposure method of this invention; the video camera 40 comprises an electro-optical device (display panel) 41, operation unit 42, audio input unit 43, and image-receiving unit 44. An exposure method of this invention is applied to fabrication of circuit patterns in semiconductor devices or similar provided in, for example, the display panel 41 or internal circuitry.

Figure 17C:
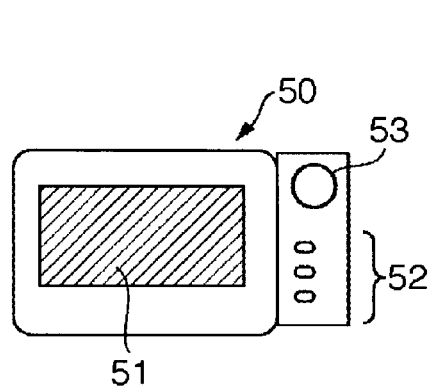
FIG. 17C is a portable personal computer.

FIG. 17C is an example of a portable personal computer in which is installed a semiconductor device manufactured using an exposure method of this invention; this computer 50 comprises an electro-optical device (display panel) 51, operation unit 52, and camera unit 53. An exposure method of this invention is applied to fabrication of circuit patterns in semiconductor devices or similar provided in, for example, the display panel 51.

Figure 17D:
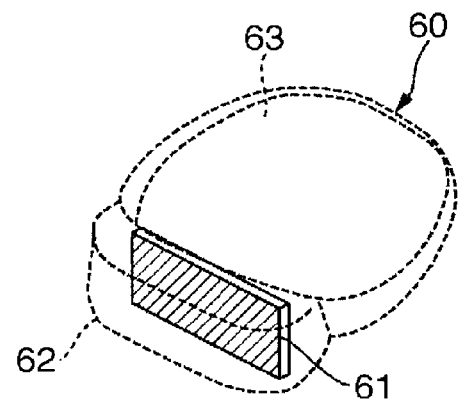
FIG. 17D is a head-mounted display.

FIG. 17D is an example of a head-mounted display in which is installed a semiconductor device manufactured using an exposure method of this invention; this head-mounted display 60 comprises an electro-optical device (display panel) 61, optical system housing unit 62, and band unit 63. An exposure method of this invention is applied to fabrication of circuit patterns in semiconductor devices or similar provided in, for example, the display panel 61 or internal circuitry.

Figure 17E:
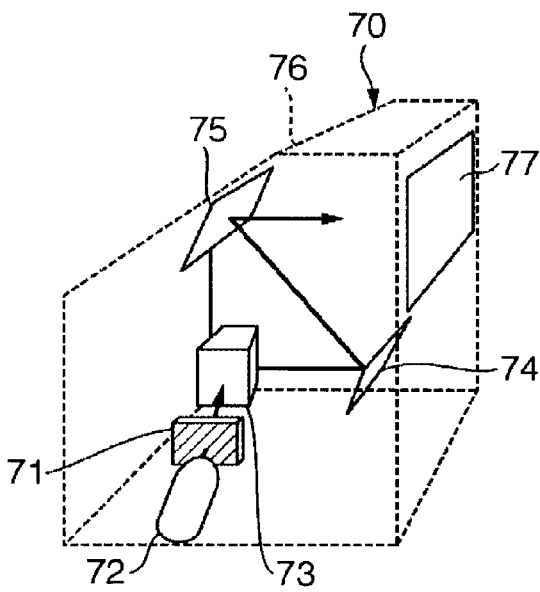
FIG. 17E is a rear-type projector.

FIG. 17E is an example of a rear-type projector in which is installed a semiconductor device manufactured using an exposure method of this invention; this projector 70 comprises a housing 76 which houses an electro-optical device (optical modulator) 71, light source 72, synthesizing optical system 73, mirrors 74 and 75, and screen 77. An exposure method of this invention is applied to fabrication of circuit patterns in semiconductor devices or similar provided in, for example, the optical modulator 71 or internal circuitry.

Figure 17F:
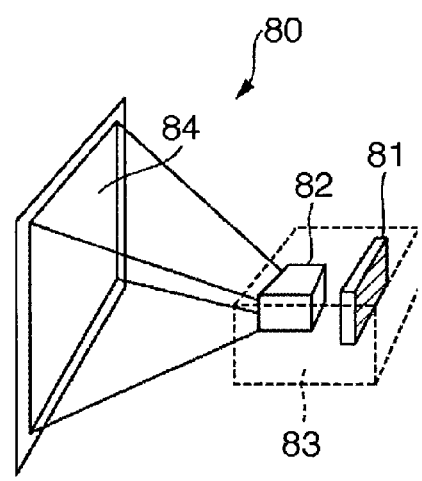
FIG. 17F is a front-type projector.

FIG. 17F is an example of a front-type projector in which is installed a semiconductor device manufactured using an exposure method of this invention; this projector 80 comprises a housing 83 which houses an electro-optical device (image display source) 81 and optical system 82, and can display images on a screen 84. An exposure method of this invention is applied to fabrication of circuit patterns in semiconductor devices or similar provided in, for example, the image display source 81 or internal circuitry.

An exposure method of this invention can be applied to the manufacture of any kind of electronic appliance, and is not limited to the above examples. For example, application to fax equipment with display functions, the viewfinders of digital cameras, portable TV sets, DSP devices, PDAs, electronic organizers, electro-optical bulletin boards, advertising displays, and IC cards is also possible.

By means of the electronic appliance of this invention, the exposure method of the above first embodiment is applied, so that similar advantageous results are obtained. That is, even if the circuit patterns of thin film transistors or other components are very fine, this exposure method can be used to perform accurate high-resolution exposure in a single exposure pass, so that very fine circuit patterns can be formed without increased manufacturing costs.

This invention is not limited to the above-described aspects, but can be variously changed and modified, within the technical scope described in the claims of this application.

By means of the exposure device and exposure method of this invention, the amount of light is controlled appropriately with respect to the film to be exposed, so that accurate exposure can be performed in a single exposure pass, without being influenced by depressions and protrusions in the film to be exposed or fluctuations in the film thickness.

Also, by means of the exposure device and exposure method of this invention, the distance between an exposure master plate and film to be exposed is maintained appropriately, [even] for a substrate for exposure having depressions and protrusions. Hence accurate exposure can be performed in a single exposure pass without the need for multiple exposure, so that processes can be greatly simplified and the precision of pattern formation can be improved.

What is claimed is:

1. An exposure device for exposure of a film to be exposed, comprising:
    a light source irradiating said film to be exposed with exposure light;
    a positioning mechanism positioning a hologram mask in the optical path of said exposure light;
    a film thickness measurement mechanism measuring the thickness of said film to be exposed; and,
    a light amount control mechanism controlling the amount of said exposure light based on said measured film thickness, and
    a prism directing the exposure light and a measurement light from a measurement light device to said film to be exposed.

2. The exposure device according to claim 1, further comprising a driving mechanism controlling the distance between said hologram mask and said film to be exposed.

3. The exposure device according to claim 2, wherein said driving mechanism comprises a first distance adjustment mechanism, and a second distance adjustment mechanism capable of finer adjustment than said first distance adjustment mechanism.

4. The exposure device according to claim 1, further comprising a scanning mechanism changing the position of said exposure light relative to said film to be exposed.

5. The exposure device according to claim 1, wherein said film thickness measurement mechanism comprises the measurement light device irradiating said film to be exposed with the measurement light, and a reflectivity analysis mechanism analyzing the reflectivity through said measurement light reflected by said film to be exposed.

6. The exposure device according to claim 5, wherein the measurement light device is an optical irradiation mechanism.

7. An exposure device for exposure of a film to be exposed, comprising:
    a light source irradiating said film to be exposed with exposure light;
    a positioning mechanism positioning a hologram mask in the optical path of said exposure light;
    a driving mechanism controlling the distance between said hologram mask and said film to be exposed; and,
    a scanning mechanism changing the position of said exposure light relative to said film to be exposed, and
    a prism directing the exposure light and a measurement light from a measurement light device to said film to be exposed.

8. The exposure device according to claim 7, wherein said driving mechanism comprises a first distance adjustment mechanism, and a second distance adjustment mechanism capable of finer adjustment than said first distance adjustment mechanism.

9. The exposure device according to claim 7, further comprising a film thickness measurement mechanism measuring the thickness of said film to be exposed, and a light amount control mechanism controlling the amount of said exposure light based on said measured film thickness.

10. The exposure device according to claim 9, wherein said film thickness measurement mechanism comprises the measurement light device irradiating said film to be exposed with the measurement light, and a reflectivity analysis mechanism analyzing the reflectivity of said measurement light reflected by said film to be exposed.

11. The exposure device according to claim 10, wherein the measurement light device is an optical irradiation mechanism.

12. An exposure method for exposure of a film to be exposed, comprising:
- a process for positioning a hologram mask in an optical path of an exposure light;
- a process for measurement of the thickness of said film to be exposed;
- a process to determine the amount of exposure light for the film to be exposed based on said measured film thickness;
- a process of irradiation of said film to be exposed with said exposure light, in said determined amount, and
- a process of directing the exposure light and a measurement light from a measurement light device to said film to be exposed via a prism.

13. The exposure method according to claim 12, further comprising a process in which the distance between said hologram mask and said film to be exposed is adjusted.

14. The exposure method according to claim 12, further comprising a process in which the position of said exposure light is changed relative to said film to be exposed.

15. A method of manufacture of semiconductor devices on a substrate, comprising the processes of the exposure method described in claim 12.

16. An exposure method for exposure of a film to be exposed, comprising:
- a process for irradiation of the film to be exposed with exposure light through a hologram mask;
- a process to change the position of said exposure light relative to said film to be exposed; and,
- a process to control the distance between said hologram mask and said film to be exposed, and
- a process of directing the exposure light and a measurement from a measurement light device to said film to be exposed via a prism.

17. The exposure method according to claim 16, further comprising a process to measure the thickness of said film to be exposed, and a process to control the amount of said exposure light based on said measured film thickness.

18. A method of manufacture of semiconductor devices on a substrate, comprising the processes of the exposure method described in claim 16.

* * * * *